(12) United States Patent
Cai

(10) Patent No.: US 12,367,701 B2
(45) Date of Patent: Jul. 22, 2025

(54) ELECTRONIC DEVICE

(71) Applicant: Honor Device Co., Ltd., Guangdong (CN)

(72) Inventor: Peizhi Cai, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 18/563,041

(22) PCT Filed: Sep. 9, 2022

(86) PCT No.: PCT/CN2022/118134
§ 371 (c)(1),
(2) Date: Nov. 21, 2023

(87) PCT Pub. No.: WO2023/124228
PCT Pub. Date: Jul. 6, 2023

(65) Prior Publication Data
US 2024/0265727 A1     Aug. 8, 2024

(30) Foreign Application Priority Data

Dec. 29, 2021   (CN) .......................... 202111641045.3

(51) Int. Cl.
*G06V 40/13*         (2022.01)
*G02B 6/42*          (2006.01)
*H10K 59/80*         (2023.01)

(52) U.S. Cl.
CPC ........... *G06V 40/1318* (2022.01); *G02B 6/42* (2013.01); *G02B 6/4298* (2013.01); *H10K 59/87* (2023.02)

(58) Field of Classification Search
CPC ............................................ G06V 40/12–1394
See application file for complete search history.

(56) References Cited

U.S. PATENT DOCUMENTS 10,664,680 B2 * 5/2020 Xu ...................... G06V 40/1318
10,685,202 B2 * 6/2020 Kim ................... G06V 40/1318
(Continued)

FOREIGN PATENT DOCUMENTS

CN        104751121 A      7/2015
CN        108490554 A      9/2018
(Continued)

OTHER PUBLICATIONS

François Flamein et al., "Fingerprint-on-Display Module Based on Organic Optical Sensors for 1-to-4-Finger Authentication in Next-Generation Smartphones," Retrieved from the Internet,URL: https://doi.org/10.1002/sdtp.14607; Jun. 28, 2021; 2 pages (English Abstract Only).

(Continued)

*Primary Examiner* — Patrick F Marinelli
(74) *Attorney, Agent, or Firm* — Rimon PC

(57) ABSTRACT

Embodiments of this application provide an electronic device. The electronic device includes a middle frame, a display, and a fingerprint recognition module. An optical waveguide structure is disposed between the display and the fingerprint recognition module. An optical exit port and at least two optical incident port are formed on the optical waveguide structure. The optical exit port is directly aligned with the fingerprint recognition module. Each optical incident port is directly aligned with a fingerprint recognition area. When a finger touches the fingerprint recognition area to reflect out fingerprint detection light, the fingerprint detection light can be incident into the optical waveguide structure through the optical incident port, and be exported to the fingerprint recognition module through the optical exit port, to implement fingerprint recognition. In this way, there are at least two fingerprint recognition areas of the electronic device.

14 Claims, 11 Drawing Sheets

(56) References Cited

U.S. PATENT DOCUMENTS

| | | | |
|---|---|---|---|
| 10,726,240 B2* | 7/2020 | Wu | G02B 6/0055 |
| 11,010,586 B2* | 5/2021 | Yang | G06V 10/141 |
| 11,275,922 B2 | 3/2022 | Du | |
| 11,341,766 B2* | 5/2022 | Gu | G06V 10/145 |
| 11,417,141 B2 | 8/2022 | Cheng et al. | |
| 11,783,616 B2* | 10/2023 | Li | G06V 40/1329 |
| | | | 382/124 |
| 11,864,433 B2* | 1/2024 | Hai | H10K 59/65 |
| 12,039,920 B2* | 7/2024 | Zou | G09G 3/20 |
| 2015/0016777 A1 | 1/2015 | Abovitz et al. | |
| 2019/0165056 A1 | 5/2019 | Lee | |
| 2020/0082143 A1* | 3/2020 | Yang | G06F 3/041 |
| 2020/0089927 A1* | 3/2020 | Wu | G02B 6/0055 |
| 2020/0234026 A1* | 7/2020 | Du | G06V 40/1312 |
| 2020/0279086 A1* | 9/2020 | Wang | G06V 40/1318 |
| 2021/0133421 A1 | 5/2021 | Zeng et al. | |
| 2021/0271845 A1 | 9/2021 | Riehl et al. | |
| 2021/0334508 A1 | 10/2021 | Meng et al. | |
| 2021/0357614 A1* | 11/2021 | Xie | G02B 6/0051 |
| 2021/0357616 A1* | 11/2021 | Gu | G06V 40/1324 |
| 2022/0165081 A1 | 5/2022 | Cheng et al. | |
| 2022/0299787 A1* | 9/2022 | Chen | G02B 5/005 |
| 2022/0399421 A1* | 12/2022 | Hai | G06V 10/145 |
| 2023/0096025 A1* | 3/2023 | Li | H01L 27/14623 |
| | | | 382/124 |

FOREIGN PATENT DOCUMENTS

| | | | |
|---|---|---|---|
| CN | 108564023 | A | 9/2018 |
| CN | 208654763 | U | 3/2019 |
| CN | 109863506 | A | 6/2019 |
| CN | 109917951 | A | 6/2019 |
| CN | 110096928 | A | 8/2019 |
| CN | 110275641 | A | 9/2019 |
| CN | 210015696 | U | 2/2020 |
| CN | 111052139 | A | 4/2020 |
| CN | 111066031 | A | 4/2020 |
| CN | 111095275 | A | 5/2020 |
| CN | 111095276 | A | 5/2020 |
| CN | 111095285 | A | 5/2020 |
| CN | 108564023 | B | 10/2020 |
| CN | 112307838 | A | 2/2021 |
| CN | 112740153 | A | 4/2021 |
| CN | 113642367 | A | 11/2021 |
| WO | 2019201108 | A1 | 10/2019 |
| WO | 2021026806 | A1 | 2/2021 |

OTHER PUBLICATIONS

Zhou Jinzhi et al., "Design of Control System for Household Strongbox Based on Dual Fingerprint Recognition," Journal of Xichang College (Natural Science Edition); Jan. 19, 2020; 5 total pages, including English abstract.

* cited by examiner

ELECTRONIC DEVICE

CROSS-REFERENCE TO RELATED APPLICATIONS

This application is a national stage of International Application No. PCT/CN2022/118134, filed on Sep. 9, 2022, which claims priority to Chinese Patent Application No. 202111641045.3, filed on Dec. 29, 2021. The disclosures of both of the aforementioned applications are hereby incorporated by reference in their entireties.

This application claims priority to Chinese Patent Application No. 202111641045.3, entitled "ELECTRONIC DEVICE", filed with the China National Intellectual Property Administration on Dec. 29, 2021, which is incorporated herein by reference in its entirety.

TECHNICAL FIELD

This application relates to the field of fingerprint recognition technologies, and in particular, to an electronic device.

BACKGROUND

With the development of fingerprint recognition technologies, electronic devices such as mobile phones, tablets (Pads), computers are equipped with fingerprint recognition apparatuses for power-on, unlocking, payment, verification, or the like. However, an existing electronic device usually has only one fingerprint recognition area, and an area of the fingerprint recognition area is small, so that a user only can touch the only one fingerprint recognition area on a display of the electronic device with a finger for fingerprint recognition, resulting in inconvenient operation.

SUMMARY

Embodiments of this application provide an electronic device, to resolve a problem that an existing electronic device usually has only one fingerprint recognition area, so that a user needs to touch the only one fingerprint recognition area on a display for fingerprint recognition, resulting in inconvenient operation.

An embodiment of this application provides an electronic device, including a middle frame, a display, a fingerprint recognition module, and an optical waveguide structure. The display is disposed on a side of the middle frame, and the display can receive finger contact. The fingerprint recognition module is disposed on a side of the display facing the middle frame. The optical waveguide structure is disposed between the display and the fingerprint recognition module. A plurality of optical incident ports are exposed on a first surface of the optical waveguide structure facing the display. The optical incident ports are directly aligned with a fingerprint recognition area of the display. An optical exit port is exposed on a second surface of the optical waveguide structure facing the fingerprint recognition module. The optical exit port is directly aligned with the fingerprint recognition module. Fingerprint detection light formed by a finger in the fingerprint recognition area can be incident into the optical waveguide structure through the optical incident port and be transmitted to the fingerprint recognition module through the optical exit port. An orthographic projection of at least one optical incident port on the first surface does not coincide with an orthographic projection of the optical exit port on the first surface.

For the electronic device provided in this embodiment of this application, the optical waveguide structure is disposed between the display and the fingerprint recognition module. The optical exit port and the at least two optical incident port are formed on the optical waveguide structure. The optical exit port is directly aligned with the fingerprint recognition module. Each optical incident port is directly aligned with the fingerprint recognition area. When a finger touches the fingerprint recognition area to reflect out fingerprint detection light, the fingerprint detection light can be incident into an interior of the optical waveguide structure through the optical incident port. The optical waveguide structure can further export the fingerprint detection light from the optical exit port to the fingerprint recognition module, to implement fingerprint recognition.

Based on the foregoing setting, the electronic device has at least two fingerprint recognition areas, and there is not only one fingerprint recognition area. In this way, the electronic device can only verify a fingerprint of one finger, or can verify fingerprints of a plurality of fingers at the same time. Fingerprint recognition manners are diverse, thereby enriching application scenarios of the electronic device, to help meet different use requirements of the user.

In a single-finger fingerprint recognition manner, the user can complete the fingerprint recognition by pressing one area that can be easily touched in a plurality of fingerprint recognition areas, to facilitate a user operation. In a multi-finger fingerprint recognition manner, the electronic device needs to compare and verify fingerprints of a plurality of fingers at the same time. In this way, security is high.

In addition, because at least one of the plurality of optical incident ports is not directly aligned with the optical exit port, there is at least one fingerprint recognition area on the electronic device that is directly aligned with the fingerprint recognition module. Even if the user presses a finger on a fingerprint recognition area that is not directly aligned with the fingerprint recognition module, based on a guidance of the optical waveguide structure, the fingerprint recognition module can also collect fingerprint information of the finger. In this way, without increasing a size and a quantity of fingerprint sensors, a quantity of the fingerprint recognition areas can be increased, to avoid excessive costs of the electronic device due to increasing the size and the quantity of the fingerprint sensors.

In a possible implementation, the optical waveguide structure includes at least one optical waveguide film layer. The optical incident port and the optical exit port are provided on each optical waveguide film layer.

In a possible implementation, the optical waveguide film layer includes a base layer, a light guide layer, and a cover layer sequentially stacked and disposed, the base layer of each optical waveguide film layer is adjacent to the second interface of the optical waveguide structure, the base layer is provided with the optical exit port, and the cover layer is provided with the optical incident port. At least one light guide layer is provided, and a refractive index of the light guide layer is greater than a refractive index of the base layer and a refractive index of the cover layer, to enable the base layer and the cover layer to perform total reflection on the fingerprint detection light.

In a possible implementation, the base layer and the cover layer are both metal layers or metal oxide layers.

In a possible implementation, the light guide layer is a film layer made of glass or a transparent resin.

In a possible implementation, the optical waveguide structure includes a plurality of optical waveguide film layers, the plurality of optical waveguide film layers are stacked and disposed, an optical waveguide film layer adjacent to a first surface of the display is a top optical waveguide film layer, and an optical waveguide film layer adjacent to a second surface of the display is a bottom optical waveguide film layer. A conduction port is provided on a cover layer of remaining optical waveguide film layers on a side of the top optical waveguide film layer facing away from the display, and the conduction port is communicated with the optical exit port of the adjacent optical waveguide film layer. The optical exit port of the bottom optical waveguide film layer is directly aligned with the fingerprint recognition module.

In a possible implementation, a conduction port of at least one optical waveguide film layer on the side of the top optical waveguide film layer facing away from the display is disposed coaxially with the optical exit port of the optical waveguide film layer.

In a possible implementation, orthographic projections of optical waveguide film layers on a surface of the display facing the middle frame coincide. An avoidance hole is provided on remaining optical waveguide film layers located on a side of the bottom optical waveguide film layer facing the display, and the optical incident port of the remaining optical waveguide film layers on the side of the top optical waveguide film layer facing away from the display is communicated with the avoidance hole, to enable the optical incident port of the remaining optical waveguide film layers on the side of the top optical waveguide film layer facing away from the display to be exposed on the first surface of the optical waveguide structure.

In a possible implementation, the orthographic projection of optical waveguide film layers on the surface of the display facing the middle frame sequentially increases from the first surface of the optical waveguide structure to the second surface of the optical waveguide structure. The optical incident port of the remaining optical waveguide film layers on the side of the top optical waveguide film layer facing away from the display is provided on an area where the optical waveguide film layer is not covered by an adjacent optical waveguide film layer.

In a possible implementation, a quantity of the optical incident port provided on each optical waveguide film layer is more than one.

In a possible implementation, thickness of the light guide layer is greater than or equal to 20 µm, and less than or equal to 40 µm. Thickness of the optical waveguide film layer is greater than or equal to 100 µm, and less than or equal to 200 µm.

In a possible implementation, the fingerprint recognition module is disposed on a side of the middle frame facing away from the display, the middle frame is provided with a through hole, and the through hole is directly aligned with the optical exit port and the fingerprint recognition module.

In a possible implementation, the fingerprint recognition module includes a lens and a fingerprint sensor, and the lens is disposed on a surface of the fingerprint sensor facing the optical waveguide structure.

In a possible implementation, the fingerprint recognition module is disposed on a surface of the middle frame facing the display.

In a possible implementation, the optical waveguide structure is connected with a surface of the display facing the fingerprint recognition module.

In a possible implementation, the optical waveguide film layer is connected with the middle frame, and the optical waveguide film layer is located between the middle frame and the display.

In a possible implementation, the display is an organic light-emitting diode display.

DESCRIPTION OF REFERENCE NUMERALS

100: mobile phone;
10: middle frame; 11: middle board; 110: through hole; 12: frame;
20: display; 21: foam layer; 22: copper foil layer;
30: fingerprint recognition module; 31: lens; 32: fingerprint sensor;
40: optical waveguide structure; 41: optical waveguide film layer; 41a: top optical waveguide film layer; 41b:

bottom optical waveguide film layer; 41c: intermediate optical waveguide film layer;

410: cover layer; 4100: optical incident port; 4101: avoidance hole; 4101a: first avoidance hole; 4101b: second avoidance hole; 4101c: third avoidance hole; 4102: conduction port;

411: light guide layer;

412: base layer; and 4120: optical exit port.

DESCRIPTION OF EMBODIMENTS

Figure 1:
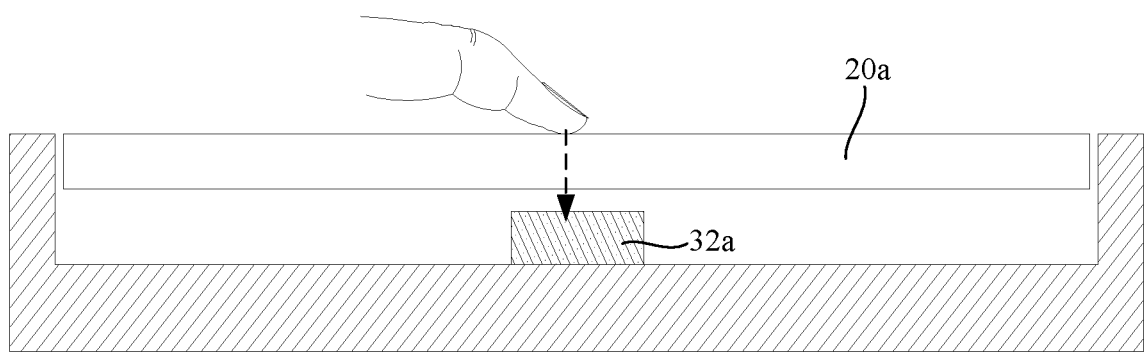
FIG. 1 is a cross sectional schematic view of a partial structure of an electronic device in a related technology.

FIG. 1 schematically shows a cross section of a partial structure of an electronic device in a related technology. FIG. 1 shows an electronic device in a related technology. The electronic device includes a display 20a and a fingerprint sensor 32a. The fingerprint sensor 32a is located below the display 20a. When a finger is placed on the display 20a directly aligned with an area of the fingerprint sensor 32a, the fingerprint sensor 32a can collect fingerprint detection light formed by reflection of a finger surface. Because only one fingerprint sensor 32a is disposed, and a size of the fingerprint sensor 32a is small, as described in the background, the display 20a of the electronic device in the related technology only has one fingerprint recognition area, and an area of the fingerprint recognition area is small. When in use, a user can only use a single finger to touch this specific location on the display 20a for fingerprint recognition. This is inconvenient to operate. For example, when one hand of the user is not idle (for example, when going shopping, the user is carrying a shopping bag in one hand), it is difficult for the user to operate the electronic device with the other hand to touch this fingerprint recognition area on the display 20a. To resolve the foregoing problem, an embodiment of this application provides an electronic device. The following describes in detail an implementation of the electronic device provided in this embodiment of this application.

Embodiment 1

Figure 2:
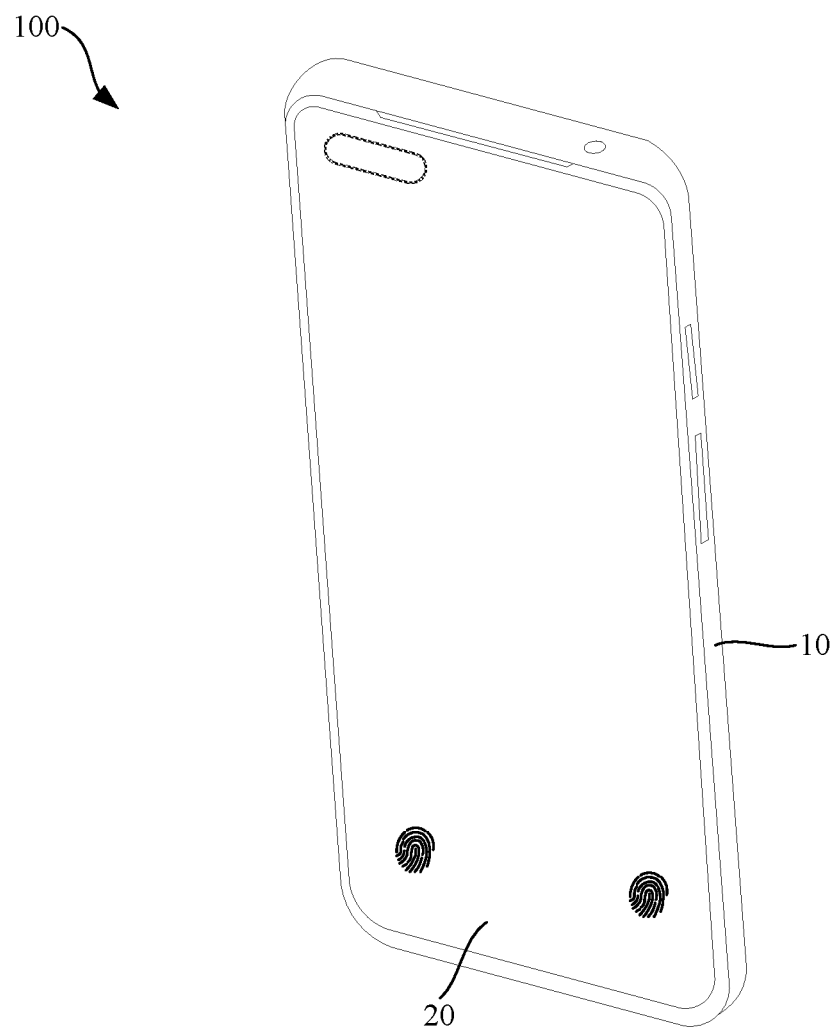
FIG. 2 is a schematic diagram of a structure in a case in which an electronic device is a mobile phone according to an embodiment of this application.

FIG. 2 schematically shows a case that an electronic device is a mobile phone 100. The electronic device is not limited to be the mobile phone 100 shown in FIG. 2, and may alternatively be a tablet computer, a notebook computer, an ultra-mobile personal computer (ultra-mobile personal computer, UMPC), a handheld computer, a walkie-talkie, a netbook, a POS machine, a personal digital assistant (personal digital assistant, PDA), a wearable device, a virtual reality device, a wireless USB flash drive, a Bluetooth speaker, a Bluetooth headset, an in-vehicle device, or another electronic device having a camera. For ease of understanding, each embodiment of this application is described by using an example in which the electronic device is the mobile phone 100.

Figure 3:
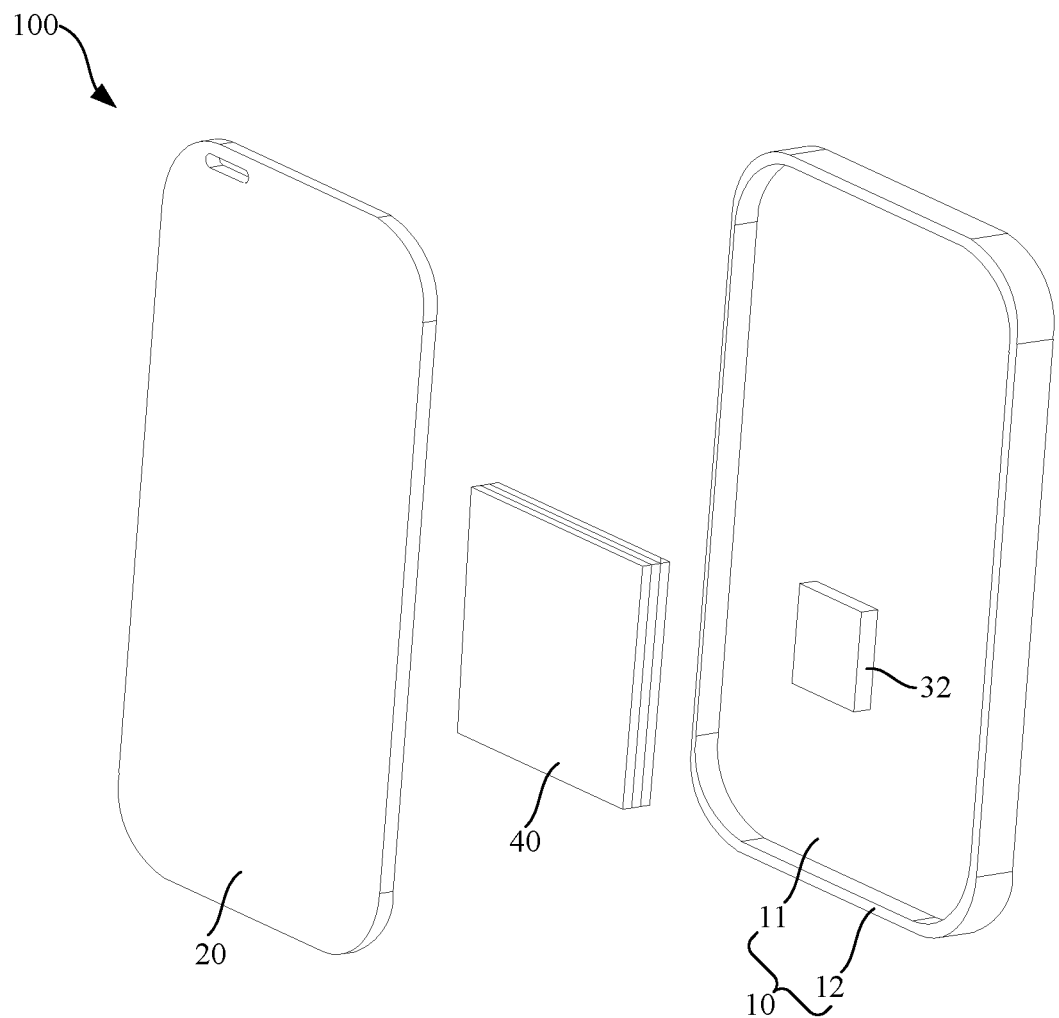
FIG. 3 is a schematic exploded view of an electronic device according to an embodiment of this application.

FIG. 3 schematically shows a partial exploded structure of the electronic device. The electronic device may specifically include a middle frame 10 and a display 20. The display 20 is disposed on the middle frame 10, and the middle frame 10 is configured to carry the display 20. When a user uses the electronic device, the display 20 faces the user. As shown in FIG. 3, the middle frame 10 may include a middle board 11 and a frame 12. The frame 12 is connected to peripheral edges of the middle board 11 and is disposed in a protruding manner facing a side where the display 20 is located. In this way, the middle board 11 and the frame 12 can be jointly enclosed to form an accommodating slot for the display 20 to be accommodated.

Figure 4:
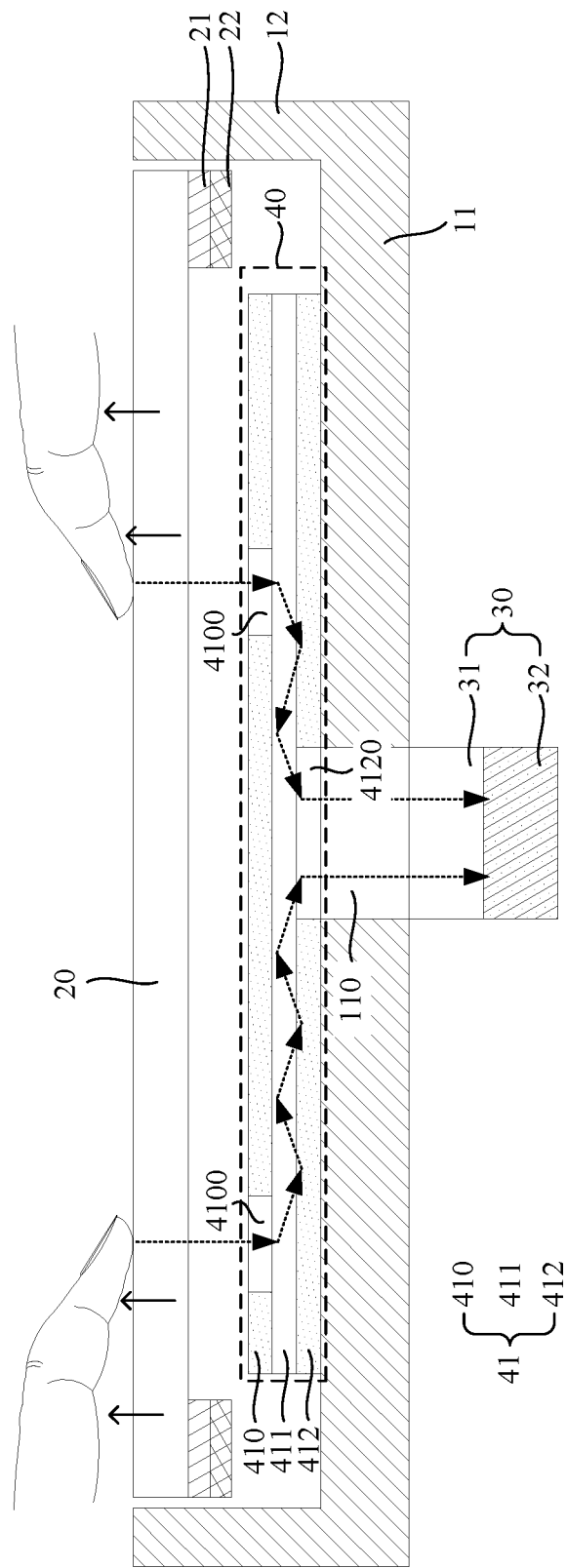
FIG. 4 is a cross sectional schematic view of a partial structure of an electronic device according to a first embodiment of this application.

FIG. 4 schematically shows a cross section of a partial structure of an electronic device according to a first embodiment. The display 20 may be, for example, an organic light-emitting diode (Organic light-emitting diode, OLED) display 20. The OLED display 20 has a characteristic of self-luminescence, so that the display 20 can emit light to display text, characters, and graphics, without setting up another light source to illuminate the display 20.

The display 20 has a display surface and a non-display surface. The display surface is a surface of the display 20 facing a user, and the non-display surface is a surface of the display 20 facing the middle board 11. An edge of the non-display surface of the display 20 may be connected with a foam layer 21, and a surface of the foam layer 21 facing away from the non-display surface is also connected with a copper foil layer 22. The foam layer 21 and the copper foil layer 22 play a supporting role, to help improve impact resistance of the display 20.

The display 20 can receive finger touch of the user, and the electronic device also has an in-screen fingerprint recognition function. Specifically, refer to FIG. 4. The electronic device includes a fingerprint recognition module 30. The fingerprint recognition module 30 is disposed on a side of the middle frame 10 facing away from the display 20. In other words, the fingerprint recognition module 30 is located below the display 20. A finger does not need to contact the fingerprint recognition module 30, and the fingerprint recognition module 30 can collect fingerprint information of the finger located above the display 20, to implement in-screen fingerprint recognition. In this way, a fingerprint recognition area is located on the display 20, so that a fingerprint recognition area does not need to be set outside the display 20, to facilitate improving a screen-to-body ratio of the electronic device. With reference to FIG. 2 and FIG. 4, two fingerprint recognition areas may be provided on the display 20 of the electronic device, and orthographic projections of the two fingerprint recognition areas on the non-display surface of the display 20 do not coincide with an orthographic projection of the fingerprint recognition module 30 on the non-display surface of the display 20, so that both the fingerprint recognition areas are not directly aligned with the fingerprint recognition module 30, which is different from that the fingerprint recognition area needs to be directly aligned with the fingerprint recognition module 30 in a related technology (as shown in FIG. 1). Certainly, in other embodiments, in the two fingerprint recognition areas, one fingerprint recognition area can be directly aligned with the fingerprint recognition module 30, and the other fingerprint recognition area is not directly aligned with the fingerprint recognition module 30.

The electronic device further includes an optical waveguide structure 40. The optical waveguide structure 40 is mounted on a surface of the middle board 11 facing the display 20, and the optical waveguide structure 40 can be opposite to the fingerprint recognition module 30. The optical waveguide structure 40 is configured to guide fingerprint detection light formed by a finger at two fingerprint recognition areas of the display 20 to the fingerprint recognition module 30. The fingerprint recognition module 30 can receive the fingerprint detection light and generate a fingerprint image based on the fingerprint detection light, and then compare the fingerprint image with a preset stored fingerprint image to complete fingerprint recognition. With reference to the foregoing description, in this embodiment, even if the fingerprint recognition area is not directly aligned with the fingerprint recognition module 30, and the user does not press a finger on an area in which the display 20 is directly aligned with the fingerprint recognition module 30, based on guidance of the optical waveguide structure 40, the fingerprint recognition module 30 can still collect fingerprint information that is not directly aligned with the fingerprint recognition module 30, to complete fingerprint recognition.

In an embodiment in which the display 20 is an OLED display 20, the OLED display 20 can be used as a light source. When the user places a finger on the fingerprint recognition area of the display 20, light emitted by the OLED display 20 is reflected on a surface of the to-be-detected finger on the display 20, to form the fingerprint detection light. In each accompanying drawing of embodiments of this application, a solid arrow refers to the light emitted by the OLED display 20, and a dotted arrow refers to the fingerprint detection light.

Figure 5:
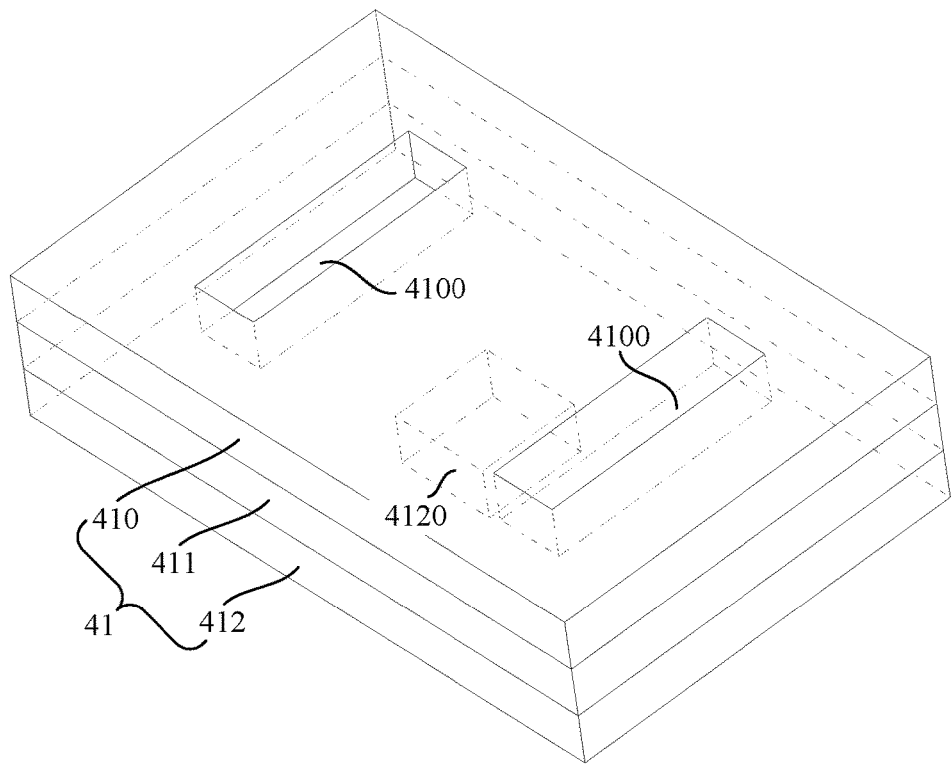
FIG. 5 is a three-dimensional schematic view of an optical waveguide structure according to an embodiment of this application.

FIG. 5 shows a structure of an optical waveguide structure 40 according to an embodiment. As shown in FIG. 4 and FIG. 5, in this embodiment, the optical waveguide structure 40 may include an optical waveguide film layer 41. The optical waveguide film layer 41 can guide fingerprint detection light formed by a finger at the fingerprint recognition area to the fingerprint recognition module 30.

For example, as shown in FIG. 4 and FIG. 5, the optical waveguide film layer 41 may include a base layer 412, a light guide layer 411, and a cover layer 410 sequentially stacked and disposed. It should be noted that, a surface of the optical waveguide structure 40 facing the display 20 is a first surface (which is a top surface in FIG. 4), and a surface of the optical waveguide structure 40 facing the middle frame 10 is a second surface (which is a bottom surface in FIG. 4). The cover layer 410 of the optical waveguide film layer 41 is adjacent to the first surface of the optical waveguide structure 40, and the base layer 412 of the optical waveguide film layer 41 is adjacent to the second surface of the optical waveguide structure 40. Therefore, when the optical waveguide film layer 41 is disposed between the middle frame 10 and the display 20, the cover layer 410 is closer to the display 20, and the base layer 412 is closer to middle frame 10.

Two optical incident ports 4100 may be provided on the cover layer 410. The two optical incident ports 4100 are directly aligned with the two fingerprint recognition areas on the display 20 respectively. An optical exit port 4120 is provided on the base layer 412, and the middle board 11 of the middle frame 10 is also provided with a through hole 110. The through hole 110 is directly aligned with the optical exit port 4120 and the fingerprint recognition module 30, so that the middle board 11 may not hinder transmission of the fingerprint detection light. The base layer 412 and the cover layer 410 are also designed to have refractive indexes much less than a refractive index of the light guide layer 411, to enable the base layer 412 and the cover layer 410 to perform total reflection on the fingerprint detection light.

In this way, as shown in FIG. 4, the fingerprint detection light can be generated when the user presses a finger on either of the two fingerprint recognition areas. After passing through the display 20, the fingerprint detection light can be directly incident into the light guide layer 411 through the optical incident port 4100. Because the refractive index of the light guide layer 411 is different from the refractive indexes of the base layer 412 and the cover layer 410, the fingerprint detection light entering the light guide layer 411 is reflected onto the base layer 412, the base layer 412 reflects all the fingerprint detection light back to the light guide layer 411, then the fingerprint detection light is reflected onto the cover layer 410 through the light guide layer 411, the cover layer 410 reflects all the fingerprint detection light back to the light guide layer 411, and so on until the fingerprint detection light is transmitted to the optical exit port 4120 and emitted from the optical exit port 4120, then the fingerprint detection light is projected to the fingerprint recognition module 30 through the through hole 110, so that the fingerprint recognition module 30 can receive the fingerprint detection light and perform fingerprint recognition.

It can be learned that the optical waveguide film layer 41 in this embodiment is designed to include the base layer 412, the cover layer 410, and the light guide layer 411 located between the base layer 412 and the cover layer 410. Because the base layer 412 and the cover layer 410 perform total reflection on the fingerprint detection light, the fingerprint detection light propagates in the light guide layer 411. In addition, the fingerprint detection light may not be transmitted from the base layer 412 or the cover layer 410 outside the optical waveguide structure 40, so that loss and leakage are not caused during a propagation process of the fingerprint detection light in the light guide layer 411, and the fingerprint recognition module 30 can receive as much fingerprint detection light as possible, to facilitate ensuring that the fingerprint recognition module 30 has a high recognition accuracy.

Specifically, the cover layer 410 may be a metal layer made of metal, for example, the cover layer 410 is a silver layer or a gold layer. Alternatively, the cover layer 410 may be a metal oxide layer made of metal oxides, for example, the cover layer 410 is a tantalum oxide (Ta2O5) layer. Therefore, the cover layer 410 is non-transparent and has a low refractive index, to perform total reflection on the fingerprint detection light.

A material of the base layer 412 may be similar to a material of the cover layer 410. In other words, the base layer 412 may also be a metal layer (such as a silver layer) or a metal oxide layer. Moreover, when the material of the base layer 412 is the same as the material of the cover layer 410, and the refractive index of the base layer 412 is the same as the refractive index of the cover layer 410, a reflection angle generated when the fingerprint detection light is transmitted to the base layer 412 is the same as a reflection angle generated when the fingerprint detection light is transmitted to the cover layer 410, so that the fingerprint detection light can propagate evenly in the light guide layer 411.

The light guide layer 411 may be a film layer made of glass, or the light guide layer 411 may alternatively be a film layer made of a transparent resin. When a material of the light guide layer 411 is glass or a transparent resin, light transmittance of the light guide layer 411 is high, so that the fingerprint detection light can be transmitted in the light guide layer 411. Certainly, in other embodiments, the light guide layer 411 may alternatively be made of another material with high refractive index.

Thickness of the light guide layer 411 is non-restrictive, for example, the thickness of the light guide layer 411 may be 20 µm to 40 µm. Therefore, the thickness of the light guide layer 411 may be specifically 20 µm, 30 µm, or 40 µm. At the same time, the thickness of the light guide layer 411, the thickness of the base layer 412, and the thickness of the cover layer 410 are properly designed, so that thickness of the optical waveguide film layer 41 is greater than or equal to 100 µm, and less than or equal to 200 µm. In this way, the thickness of the optical waveguide film layer 41 is not too large. This helps avoiding excessive thickness of the entire electronic device, to facilitate realization of a thin electronic device.

Figure 6:
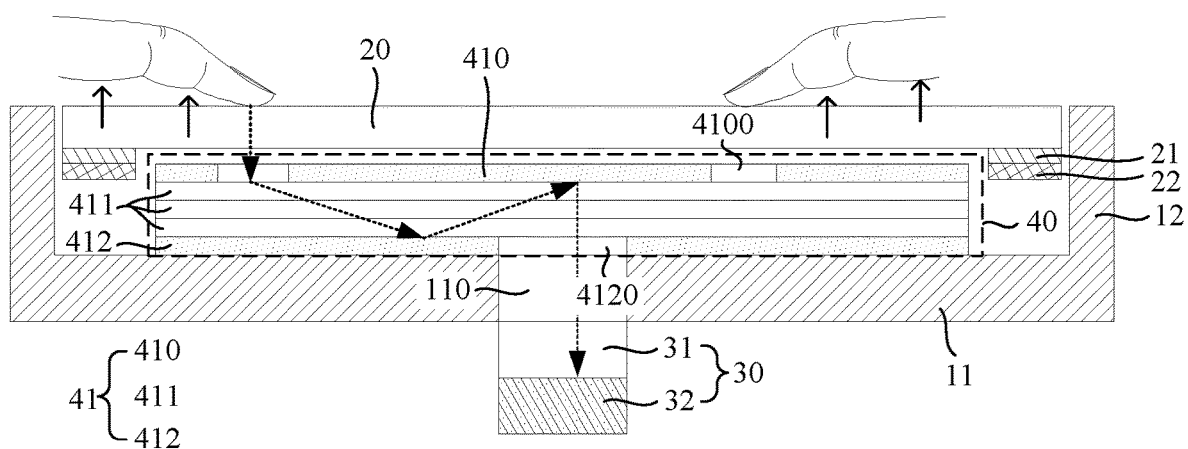
FIG. 6 is a cross sectional schematic view of a partial structure of an electronic device according to a second embodiment of this application.

A quantity of the light guide layers 411 is not limited to be one shown in FIG. 4 and FIG. 5. In other embodiments, a plurality of light guide layers 411 may be disposed, for example, an optical waveguide film layer 41 shown in FIG. 6 has three light guide layers 411. FIG. 6 schematically shows a cross section of a partial structure of an electronic device according to a second embodiment. An example shown in FIG. 6 is compared with an example shown in FIG. 4. When a plurality of light guide layers 411 are provided, the plurality of light guide layers 411 are stacked and disposed. In this case, fingerprint detection light projected to an optical incident port 4100 needs to be transmitted to the base layer 412 through the plurality of light guide layers 411. The fingerprint detection light is propagated in the light guide layers 411 for a long time to be transmitted to the base layer 412 or the cover layer 410. This facilitates reducing refraction times in a process in which the fingerprint detection light is transmitted from the optical incident port 4100 to the optical exit port 4120. When a plurality of light guide layers 411 are provided, materials of light guide layers 411 may be the same or different. For example, when the optical waveguide film layer 41 has two light guide layers 411, a material of one light guide layer 411 may be glass, and a material of the other light guide layer 411 may be a transparent resin.

A shape of the optical incident port 4100 may be round, or may be another shape, for example, square, rectangular, or ovals. An opening area of the optical incident port 4100 is not less than an area of a fingerprint recognition area, so that fingerprint detection light formed by a finger at the fingerprint recognition area can be all transmitted from the optical incident port 4100 into the optical waveguide film layer 41, to be guided by the optical waveguide film layer 41 to the fingerprint recognition module 30. At the same time, the opening area of the optical incident port 4100 cannot be too large, to avoid that the fingerprint detection light is emitted from the optical incident port 4100 based on reflection of the base layer 412 after the fingerprint detection light is transmitted to the base layer 412 through the light guide layer 411.

It is understood in a broad sense that the optical incident port 4100 is directly aligned with the fingerprint recognition area. In other words, it can be understood that the orthographic projection of the optical incident port 4100 on the non-display surface of the display 20 completely coincides or partially coincides with the orthographic projection of the fingerprint recognition area on the non-display surface of the display 20. A location of the optical incident port 4100 is not limited. Accordingly, a location of the fingerprint recognition area that is directly aligned with the optical incident port 4100 on the display 20 can also not be limited. For example, as shown in FIG. 2, both fingerprint recognition areas can be adjacent to bottom of the electronic device, and the two fingerprint recognition areas are located on a left side and a right side of the electronic device respectively. Alternatively, the two fingerprint recognition areas may be located on top and bottom of the electronic device respectively.

For example, in FIG. 4, because the orthographic projections of the two fingerprint recognition areas on the non-display surface of the display 20 does not coincide with the orthographic projection of the fingerprint recognition module 30 on the non-display surface of the display 20, an orthographic projection of the two optical incident ports 4100 on the first surface of the optical waveguide structure 40 does not coincide with orthographic projection of the optical exit port 4120 on the first surface of the optical waveguide structure 40. In other words, the orthographic projections of the optical incident port 4100 and the optical exit port 4120 on the first surface of the optical waveguide structure 40 can be staggered, so that the two optical incident ports 4100 may not be directly aligned with the optical exit port 4120. Certainly, in an embodiment in which in the two fingerprint recognition areas, one fingerprint recognition area is directly aligned with the fingerprint recognition module 30 and the other fingerprint recognition area is not directly aligned with the fingerprint recognition module 30, the two optical incident ports 4100 are designed so that one optical incident port 4100 is directly aligned with the optical exit port 4120 and the other optical incident port 4100 is not directly aligned with the optical exit port 4120.

For the optical incident port 4100 that is not directly aligned with the optical exit port 4120, the optical incident port 4100 may be disposed adjacent to the optical exit port 4120, so that the refraction times in a process in which the fingerprint detection light transmitted into the light guide layer 411 through the optical incident port 4100 is conducted to the optical exit port 4120 is as less as possible. In other words, a transmission path of the fingerprint detection light in the optical waveguide structure 40 is as short as possible, to facilitate improving a rate at which the fingerprint recognition module 30 receives the fingerprint detection light.

That the optical exit port 4120 is directly aligned with the fingerprint recognition module 30 is not limited to be understood that the orthographic projection of the optical exit port 4120 on the first surface of the optical waveguide structure 40 completely coincides with the orthographic projection of the fingerprint recognition module 30 on the first surface of the optical waveguide structure 40, or may be understood that the orthographic projections of the optical exit port 4120 and the fingerprint recognition module 30 on the first surface of the optical waveguide structure 40 coincide.

In the example shown in FIG. 4, the fingerprint recognition module 30 may specifically include a fingerprint sensor 32 and a lens 31. The lens 31 is disposed on a surface of the fingerprint sensor 32 facing the optical waveguide structure 40. In other words, the lens 31 is located between the optical waveguide structure 40 and the fingerprint sensor 32. The fingerprint sensor 32 can be configured for optical detection. The fingerprint sensor 32 receives the fingerprint detection light and detects corresponding fingerprint information based on the fingerprint detection light. The lens 31 plays a guiding role to converge the fingerprint detection light emitted from the optical exit port 4120 of the optical waveguide structure 40 to the fingerprint sensor 32. This facilitates improving fingerprint recognition accuracy of the fingerprint sensor 32. The fingerprint recognition module 30 can be disposed adjacent to the bottom of the electronic device, or adjacent to middle or an edge of the electronic device. This is not limited in this embodiment.

Based on the foregoing setting, the display 20 of the electronic device provided in this embodiment is provided with two fingerprint recognition areas. The optical waveguide film layer 41 is disposed between the middle frame 10 and the display 20. The two optical incident ports 4100 of the optical waveguide film layer 41 is aligned with the two fingerprint recognition areas respectively. The optical exit port 4120 of the optical waveguide film layer 41 is aligned with the fingerprint recognition module 30 on the side of the middle frame 10 facing away from the display 20. In this way, the fingerprint detection light reflected by the finger when pressing on the two fingerprint recognition areas can be transmitted by the optical waveguide film layer 41 to the fingerprint recognition module 30, and the fingerprint recognition module 30 can complete fingerprint recognition based on the fingerprint detection light. In this way, the electronic device has two fingerprint recognition locations.

In a possible case, the electronic device may be configured that: When a fingerprint image matches a preset stored fingerprint image, fingerprint is recognized successfully. In this case, the user can complete fingerprint recognition with a single finger. Specifically, the user can pre-record and store one or more fingerprint images on the electronic device. When the user needs to boot, pay, unlock, or verify, a single to-be-detected finger can be pressed on either of the two fingerprint recognition areas, and a surface of the to-be-detected finger can reflect light to form the fingerprint detection light. The fingerprint detection light is transmitted into the light guide layer 411 through the corresponding optical incident port 4100, the fingerprint detection light propagated in the light guide layer 411 is transmitted from the optical exit port 4120 to the lens 31, the lens 31 collects the fingerprint detection light to the fingerprint sensor 32, and the fingerprint sensor 32 can perform optical imaging based on the received fingerprint detection light and compare an obtained image with a pre-recorded fingerprint image to complete fingerprint recognition.

In this example, when the user presses a finger on either of the two fingerprint recognition areas, the electronic device can recognize a fingerprint and unlock, verify, or pay based on a recognition result. In this way, the electronic device has two unlock locations, and the two unlock locations are optional, so that, during using, the user can choose to touch the fingerprint recognition area corresponding to either of the two unlock locations depending on an actual situation, to facilitate a user operation.

Specifically, in the conventional technology, a display 20 of an electronic device has only one fingerprint recognition area. For example, the fingerprint recognition area is located in middle of the display 20, and the preset fingerprint image is a fingerprint of a right thumb. If a left hand of the user is not idle when the user is unlocking the electronic device, the user needs to hold the electronic device with his right hand and extend the right thumb to the middle of the display 20 to touch the fingerprint recognition area, resulting in difficulty in operation. Especially for the trend of the electronic device to a large-screen device, if a size of the display 20 of the electronic device is larger, when the user is unlocking with one hand, the right thumb needs to extend a larger distance to touch the fingerprint recognition area, which is inconvenient to use.

In this embodiment, two fingerprint recognition areas are formed on the display 20 of the electronic device. For example, the two fingerprint recognition areas are adjacent to the bottom of the electronic device, and the two fingerprint recognition areas are located on the left side and the right side of the electronic device respectively (as shown in FIG. 2). If a pre-stored fingerprint image of the user is the fingerprint of the right thumb, when the left hand of the user is not idle and the right hand holds the electronic device to unlock, the user can easily press the right thumb in the fingerprint recognition area located on the right side of the electronic device. This is convenient to operate.

In another possible implementation, the electronic device is a mobile phone. When there are two fingerprint image that matches the preset saved fingerprint image at the same time, fingerprint recognition is successful. In this case, the user can use two fingers to complete fingerprint recognition. Specifically, the user can pre-record and store a plurality of fingerprint images on the electronic device. When the user needs to power on, pay, unlock, or verify, two to-be-detected fingers can be pressed on the two fingerprint recognition areas respectively. Fingerprint detection light reflected by the two to-be-detected fingers is respectively transmitted into the light guide layer 411 through the two optical incident ports 4100 of the optical waveguide film layer 41, and both are emitted from the optical exit port 4120 to the fingerprint sensor 32. The fingerprint sensor 32 receives two pieces of fingerprint detection light at the same time, obtains two fingerprint images corresponding to the fingerprint detection light, and compares the two images with the pre-recorded fingerprint images to complete fingerprint recognition.

It can be learned that in this example, the user needs to press two fingers on a fingerprint recognition area at the same time, so that the electronic device can recognize a fingerprint and unlock, verify, or pay based on a recognition result. In this way, there are many fingerprint images that the electronic device needs to compare and verify, and security is high.

In summary, the electronic device can not only perform fingerprint recognition with an operation performed by a single finger, but also perform fingerprint recognition with an operation performed by two fingers. The fingerprint recognition manners are diverse, thereby enriching application scenarios of the electronic device, to help meet different use requirements of the user.

Figure 7A:
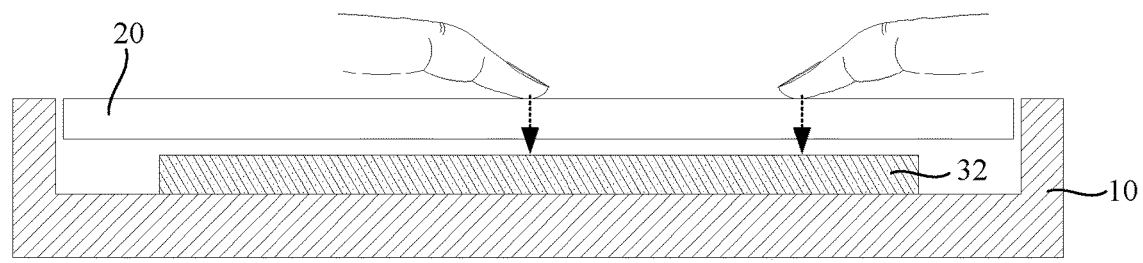
FIG. 7a and FIG. 7b are cross sectional schematic views of partial structures of other electronic devices in a related technology.
Figure 7B:
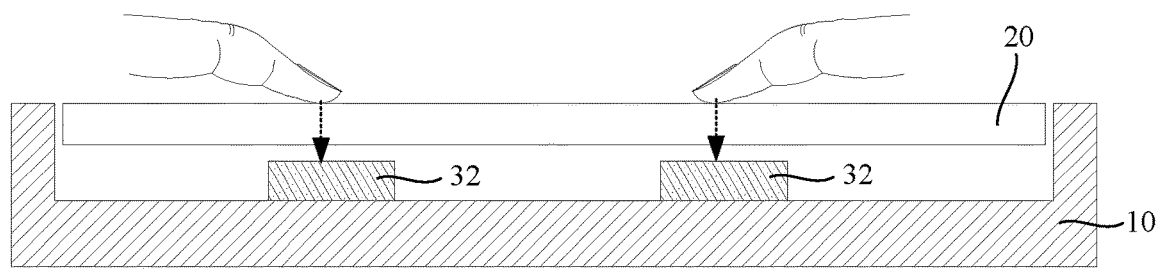

FIG. 7a and FIG. 7b schematically show cross sections of partial structures of electronic devices in other embodiments in a related technology. It should be noted that, to improve convenience of a single-finger fingerprint recognition action of the user, a person skilled in the art easily conceives of increasing a size of the fingerprint sensor 32 (as shown in FIG. 7a). In this way, an area of the fingerprint recognition area corresponding to the fingerprint sensor 32 on the display 20 is increased, so that the user can easily touch the fingerprint recognition area even if the user operates the electronic device with one hand. Alternatively, a person skilled in the art easily conceives of providing a plurality of fingerprint sensors 32 (as shown in FIG. 7b). In this way, a plurality of fingerprint recognition areas are formed on the display 20, so that when operating the electronic device with one hand, the user can choose to touch any fingerprint recognition area depending on a situation to complete fingerprint recognition. In addition, to implement two-finger unlocking, a person skilled in the art easily conceives of increasing the size of the fingerprint sensor 32 or increasing a quantity of the fingerprint sensors 32. In an implementation of increasing the size of the fingerprint sensor 32, the area of the fingerprint recognition area corresponding to the fingerprint sensor 32 on the display 20 is increased, and the fingerprint recognition area can receive touch of two fingers at the same time. In an implementation of increasing the quantity of the fingerprint sensors 32, a plurality of fingerprint recognition areas are formed on the display 20, and the user can touch different fingerprint recognition areas with two fingers at the same time.

However, the area of the fingerprint recognition area is increased by increasing the size of the fingerprint sensor 32, or, the quantity of the fingerprint recognition areas is increased by increasing the quantity of the fingerprint sensor 32. In this way, although convenience of the single-finger fingerprint recognition action of the user can be improved or two-finger unlocking can be implemented, a price of the fingerprint sensor 32 is high, resulting in increasing costs of the electronic device. The fingerprint recognition area needs to be designed to be directly aligned with the fingerprint recognition module 30, and a location of the fingerprint recognition area has limitations.

In this embodiment, the optical waveguide structure 40 is disposed between the display 20 and the fingerprint recognition module 30. Because the optical waveguide structure 40 can transmit fingerprint detection light formed by the finger in a fingerprint recognition area not directly aligned with the fingerprint recognition module 30 to the fingerprint recognition module 30, so that the fingerprint recognition module 30 can collect fingerprint information not directly aligned with the fingerprint recognition module 30. Therefore, the fingerprint recognition area may not be limited to being directly aligned with the fingerprint recognition module 30. In this way, in this embodiment, the size and the quantity of the fingerprint sensors 32 do not need to be increased, and the quantity of the fingerprint recognition areas can be increased, so that single-finger fingerprint recognition is convenient to operate or two-finger fingerprint recognition can be implemented. Therefore, this facilitates avoiding excessive costs of the electronic device due to increasing the size or the quantity of the fingerprint sensor 32, and at least one fingerprint recognition area may not be directly aligned with the fingerprint recognition module 30.

Certainly, in some embodiments, a quantity of the optical incident ports 4100 is not limited to be two shown in FIG. 4 and FIG. 5. The quantity of the optical incident ports 4100 may be at least three, and the orthographic projection of at least one optical incident port 4100 on the first surface of the optical waveguide structure 40 does not coincide with the orthographic projection of the fingerprint recognition module 30 on the first surface of the optical waveguide structure 40. For example, three, four, or five optical incident ports 4100 may be provided on the cover layer 410. It may be understood that more quantity of the optical incident ports 4100 indicates more fingerprint recognition areas on the display 20. In this setting, the electronic device can perform fingerprint recognition with the operation of single finger, two fingers or even at least three fingers. The fingerprint recognition manners are diverse, thereby enriching application scenarios of the electronic device, to help meet different use requirements of the user. In a case of single-finger fingerprint recognition, more selectivity in the fingerprint recognition area that the user can touch may exist. When in use, the user can choose to press any of at least three fingerprint recognition areas depending on an actual situation. This is convenient to operate. In a case of multi-finger fingerprint recognition, there are many fingerprint images that the electronic device needs to compare and verify. This greatly improves security of the electronic device.

The optical waveguide structure 40 may be fastened with the middle frame 10 by bonding, or fastened with the middle frame 10 by threading or snapping. For example, when the optical waveguide structure 40 is bonded to the middle frame 10, at least one of the second surface of the optical waveguide structure 40 and a surface of the middle board 11 facing the display 20 may be provided with an adhesive layer.

Figure 8:
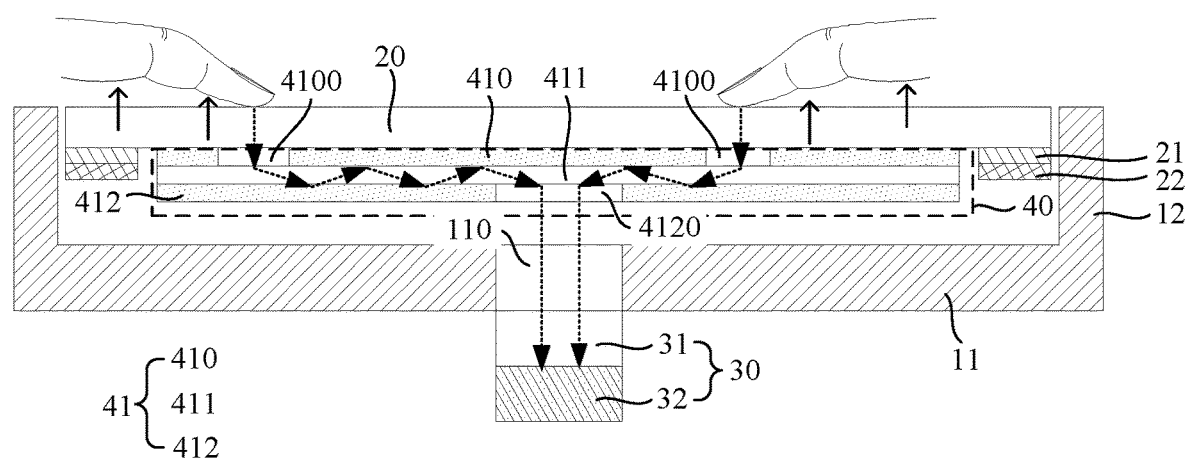
FIG. 8 is a cross sectional schematic view of a partial structure of an electronic device according to a third embodiment of this application.

FIG. 8 schematically shows a cross section of a partial structure of an electronic device according to a third embodiment. As an alternative embodiment, as shown in FIG. 8, the optical waveguide structure 40 may also be mounted on a surface of the display 20 facing the middle frame 10. In other words, the optical waveguide structure 40 is connected to the non-display surface of the display 20. For example, the optical waveguide structure 40 may alternatively be connected to the non-display surface of the display 20 with an adhesive glue, to avoid damaging the display 20.

Figure 9:
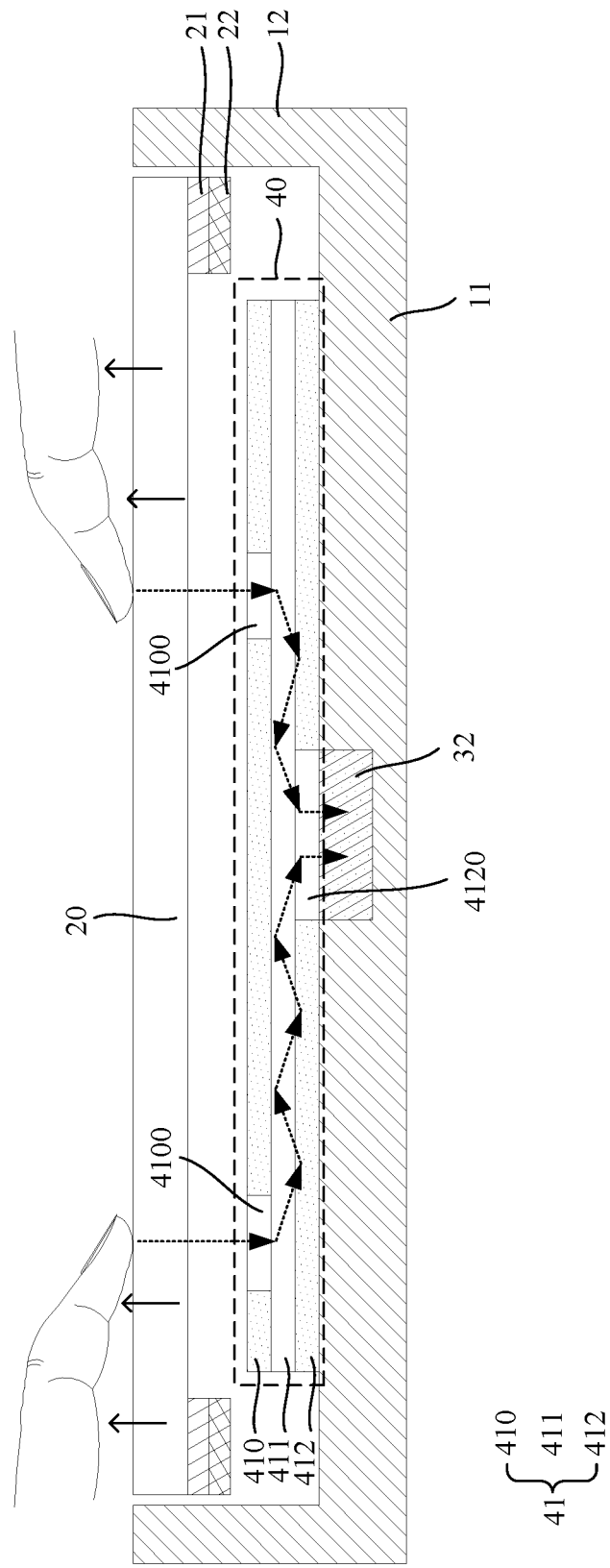
FIG. 9 is a cross sectional schematic view of a partial structure of an electronic device according to a fourth embodiment of this application.
Figure 10:
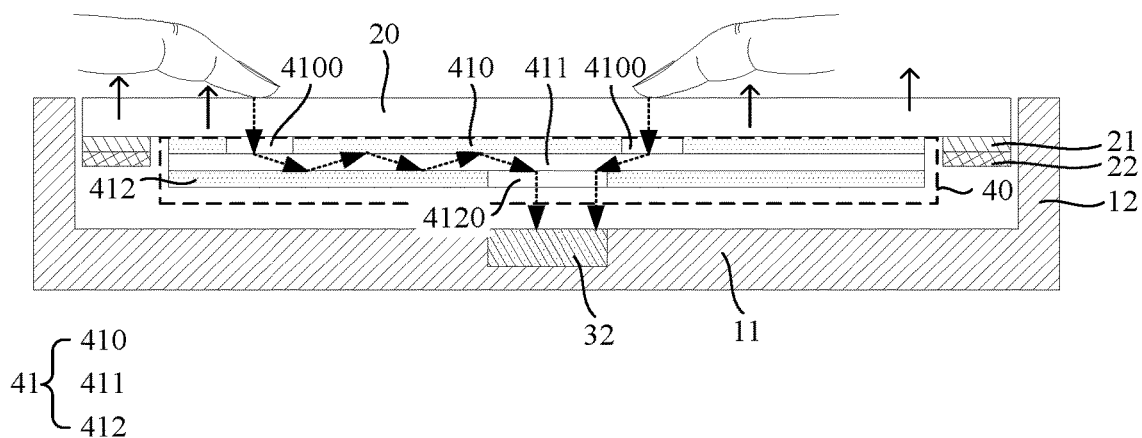
FIG. 10 is a cross sectional schematic view of a partial structure of an electronic device according to a fifth embodiment of this application.

FIG. 9 and FIG. 10 schematically show cross sections of partial structures of electronic devices according to a fourth embodiment and a fifth embodiment, respectively. Specifically, as shown in FIG. 9 and FIG. 10, the fingerprint recognition module 30 may alternatively be disposed on the surface of the middle board 11 facing the display 20. In this example, the fingerprint recognition module 30 is located between the optical waveguide structure 40 and the middle board 11. A through hole 110 does not need to be provided on the middle board 11. The fingerprint detection light exported from the optical exit port 4120 of the optical waveguide structure 40 can be transmitted to the fingerprint recognition module 30 without passing through the through hole 110. In this setting, the optical waveguide structure 40 and the fingerprint recognition module 30 can be tightly attached, and the fingerprint detection light exported from the optical waveguide structure 40 can be directly guided to the fingerprint recognition module 30, so that a phase of transmission of the fingerprint detection light from the through hole 110 is eliminated. This facilitates reducing optical loss, thereby ensuring accuracy of fingerprint recognition.

Because the optical waveguide structure 40 is attached to the fingerprint recognition module 30, and the fingerprint detection light exported from the optical waveguide structure 40 can be directly guided to the fingerprint recognition module 30, in this embodiment, the fingerprint detection light is collected without help of the lens 31. In other words, the fingerprint recognition module 30 may only include the fingerprint sensor 32, and does not include the lens 31. Therefore, a structure of the fingerprint recognition module 30 is simple.

Embodiment 2

According to Embodiment 1, this embodiment differs from Embodiment 1 in a quantity of optical waveguide film layers 41 included in the optical waveguide structure 40. Embodiment 1 describes that the optical waveguide structure 40 includes one optical waveguide film layer 41. This embodiment describes that the optical waveguide structure 40 may include a plurality of optical waveguide film layers 41, and the plurality of optical waveguide film layers 41 are sequentially stacked and disposed. For example, for the entire optical waveguide structure 40, the quantity of the optical waveguide film layers 41 may be two, three, four, or the like.

Figure 11:
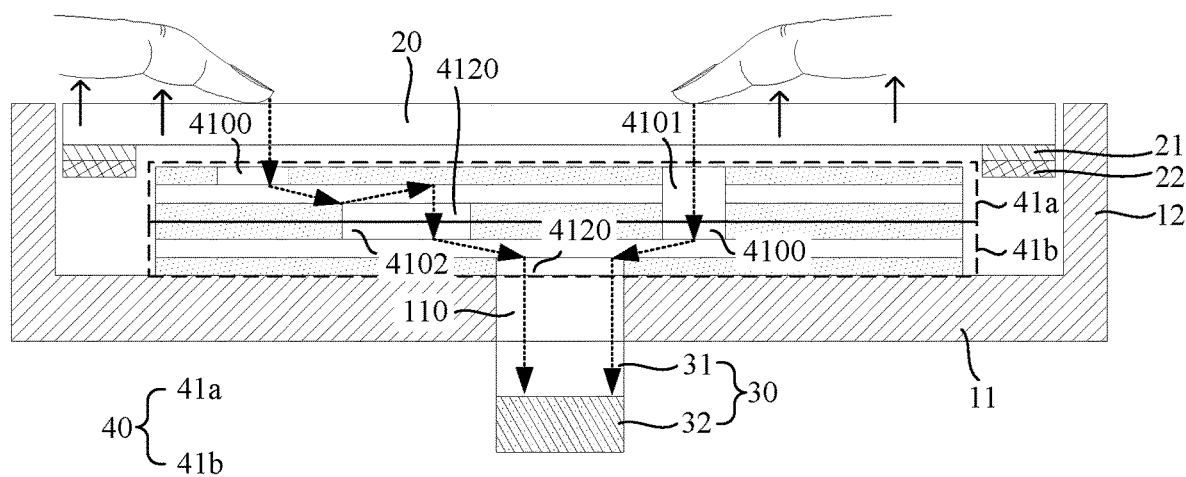
FIG. 11 is a cross sectional schematic view of a partial structure of an electronic device according to a sixth embodiment of this application.

That the optical waveguide structure 40 includes two optical waveguide film layers 41 is used as an example. FIG. 11 schematically shows a cross section of a partial structure of an electronic device according to a sixth embodiment. As shown in FIG. 11, the two optical waveguide film layers 41 of the optical waveguide structure 40 are stacked and disposed. A cover layer 410 of each optical waveguide film layer 41 is disposed adjacent to a first surface of the optical waveguide structure 40, and a base layer 412 of each optical waveguide film layer 41 is disposed adjacent to a second surface of the optical waveguide structure 40. For ease of description, one of the two optical waveguide film layers 41 adjacent to the display 20 is referred to as a top optical waveguide film layer 41a, and the other of the two optical waveguide film layers 41 away from the display 20 is referred to as a bottom optical waveguide film layer 41b.

Figure 12:
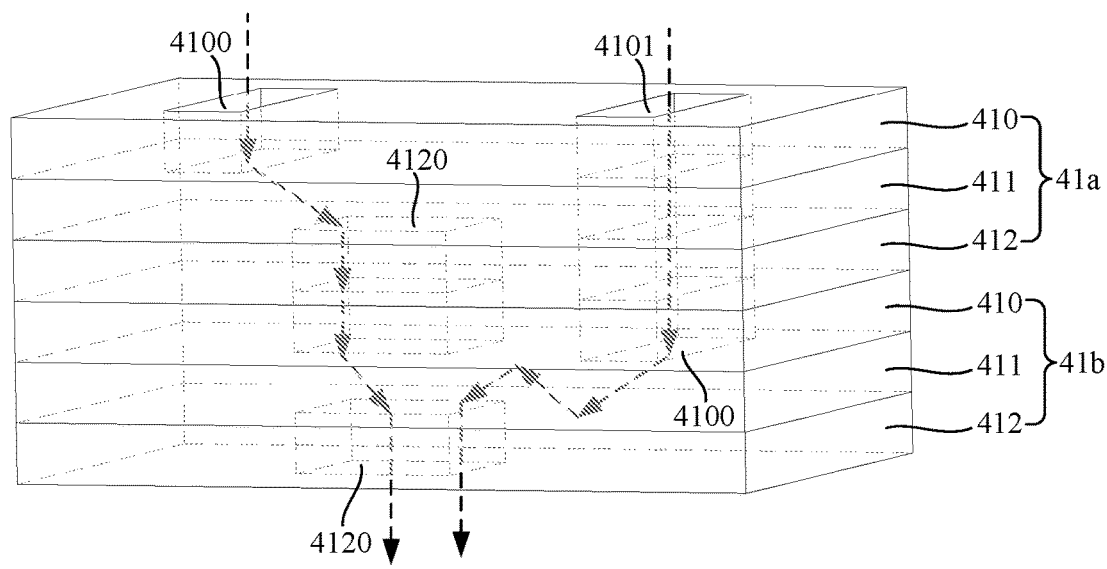
FIG. 12 is a three-dimensional schematic view of an optical waveguide structure according to another embodiment of this application.

FIG. 12 shows an optical waveguide structure 40 according to another embodiment. In one embodiment, as shown in FIG. 11 and FIG. 12, orthographic projections of the two optical waveguide film layers 41 on the non-display surface of the display 20 may coincide. The cover layer 410 of the top optical waveguide film layer 41*a* may be provided with an optical incident port 4100. The optical incident port 4100 is directly aligned with a fingerprint recognition area on the display 20. The base layer 412 of the top optical waveguide film layer 41*a* is provided with an optical exit port 4120. The cover layer 410 of the bottom optical waveguide film layer 41*b* may be provided with an optical incident port 4100 and a conduction port 4102. The conduction port 4102 is communicated with the optical exit port 4120 of the top optical waveguide film layer 41*a*. The base layer 412 of the bottom optical waveguide film layer 41*b* is provided with an optical exit port 4120. The optical exit port 4120 is directly aligned with the fingerprint recognition module 30. In addition, the top optical waveguide film layer 41*a* is also provided with an avoidance hole 4101. The avoidance hole 4101 runs through the top optical waveguide film layer 41*a*, and is directly aligned with and communicated with the optical incident port 4100 on the bottom optical waveguide film layer 41*b*, so that the optical incident port 4100 on the bottom optical waveguide film layer 41*b* is exposed on the first surface of the optical waveguide structure 40, and the optical incident port 4100 is directly aligned with another fingerprint recognition area on the display 20.

In this design, the conduction port 4102 on the bottom optical waveguide film layer 41*b* can conduct the top optical waveguide film layer 41*a* and the bottom optical waveguide film layer 41*b*. The optical incident port 4100 of the top optical waveguide film layer 41*a* of the optical waveguide structure 40, the light guide layer 411 of the top optical waveguide film layer 41*a*, the optical exit port 4120 of the top optical waveguide film layer 41*a*, the conduction port 4102 of the bottom optical waveguide film layer 41*b*, the light guide layer 411 of the bottom optical waveguide film layer 41*b*, and the optical exit port 4120 of the bottom optical waveguide film layer 41*b* are sequentially communicated to form a light transmission path, to guide the fingerprint detection light to the fingerprint recognition module 30. In the light transmission path, the top optical waveguide film layer 41*a* is located upstream of a transmission path of the fingerprint detection light, and the bottom optical waveguide film layer 41*b* is located downstream of the transmission path of the fingerprint detection light. In addition, the avoidance hole 4101 of the top optical waveguide film layer 41*a*, the optical incident port 4100 of the bottom optical waveguide film layer 41*b*, the light guide layer 411 of the bottom optical waveguide film layer 41*b*, and the optical exit port 4120 of the bottom optical waveguide film layer 41*b* are sequentially communicated to form a light transmission path.

When in use, when a finger is pressed on a fingerprint recognition area opposite to the optical incident port 4100 of the top optical waveguide film layer 41*a*, light emitted by the OLED display 20 is reflected on a surface of the finger to form fingerprint detection light, and the fingerprint detection light can be sequentially transmitted to the fingerprint recognition module 30 through the top optical waveguide film layer 41*a* and the bottom optical waveguide film layer 41*b*. In addition, the avoidance hole 4101 is provided on the top optical waveguide film layer 41*a*, so that the top optical waveguide film layer 41*a* does not block the optical incident port 4100 of the bottom optical waveguide film layer 41*b* and the fingerprint recognition area, and the optical incident port 4100 of the bottom optical waveguide film layer 41*b* can be exposed. When the user presses the finger on a fingerprint recognition area opposite to the optical incident port 4100 of the bottom optical waveguide film layer 41*b*, the fingerprint detection light can be directly emitted into the optical incident port 4100 of the bottom optical waveguide film layer 41*b*, and directly transmitted from the bottom optical waveguide film layer 41*b* to the fingerprint recognition module 30.

Figure 13:
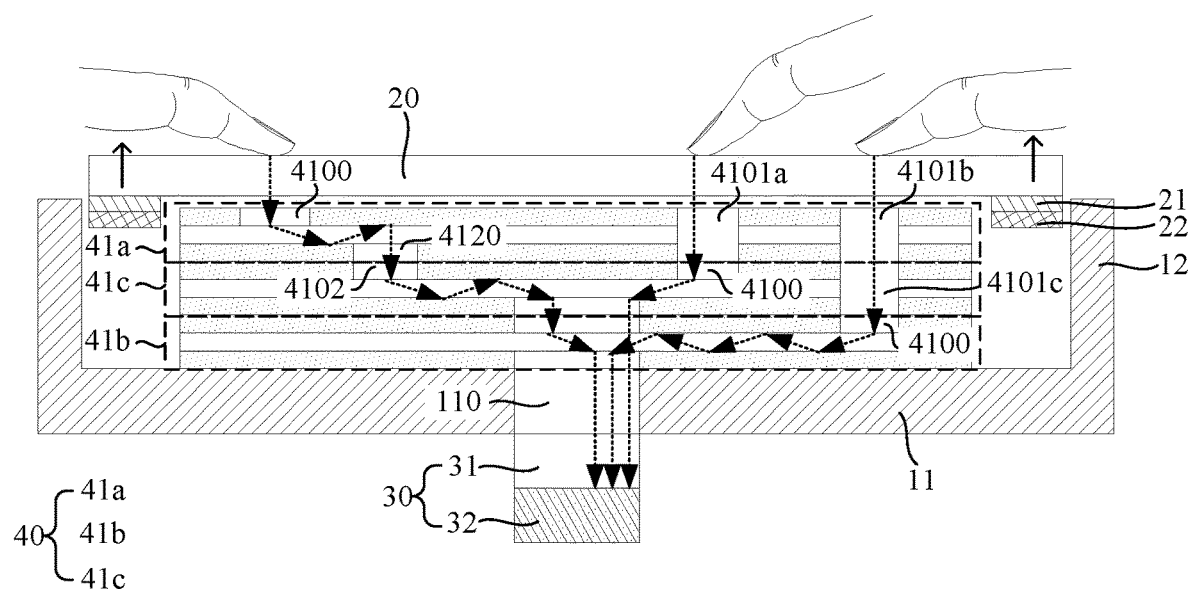
FIG. 13 is a cross sectional schematic view of a partial structure of an electronic device according to a seventh embodiment of this application.

That the optical waveguide structure 40 includes three optical waveguide film layers 41 is used as an example. FIG. 13 schematically shows a cross section of a partial structure of an electronic device according to a seventh embodiment. As shown in FIG. 13, the three optical waveguide film layers 41 of the optical waveguide structure 40 are stacked and disposed. A cover layer 410 of each optical waveguide film layer 41 is disposed adjacent to the first surface of the optical waveguide structure 40, and a base layer 412 of each optical waveguide film layer 41 is disposed adjacent to the second surface of the optical waveguide structure 40. For ease of description, one of the three optical waveguide film layers 41 adjacent to the display 20 is referred to as a top optical waveguide film layer 41*a*, another one of the three optical waveguide film layers 41 adjacent to the middle board 11 is referred to as a bottom optical waveguide film layer 41*b*, and one of the three optical waveguide film layers 41 located in the middle is referred to as an intermediate optical waveguide film layer 41*c*.

Orthographic projections of the top optical waveguide film layer 41*a*, the intermediate optical waveguide film layer 41*c*, and the bottom optical waveguide film layer 41*b* on the non-display surface of the display 20 all coincide. The cover layer 410 of the top optical waveguide film layer 41*a* may be provided with an optical incident port 4100. The optical incident port 4100 is directly aligned with a fingerprint recognition area on the display 20. The base layer 412 of the top optical waveguide film layer 41*a* is provided with an optical exit port 4120. The cover layer 410 of the intermediate optical waveguide film layer 41*c* may be provided with an optical incident port 4100 and a conduction port 4102. The optical incident port 4100 is directly aligned with another fingerprint recognition area on the display 20. The conduction port 4102 is communicated with the optical exit port 4120 of the top optical waveguide film layer 41*a*. The base layer 412 of the intermediate optical waveguide film layer 41*c* is provided with an optical exit port 4120. The cover layer 410 of the bottom optical waveguide film layer 41*b* may be provided with an optical incident port 4100 and a conduction port 4102. The optical incident port 4100 is directly aligned with still another fingerprint recognition area on the display 20. The conduction port 4102 is communicated with the optical exit port 4120 of the intermediate optical waveguide film layer 41*c*. The base layer 412 of the bottom optical waveguide film layer 41*b* is provided with an optical exit port 4120. The optical exit port 4120 is directly aligned with the fingerprint recognition module 30.

In addition, the top optical waveguide film layer 41*a* is provided with a first avoidance hole 4101*a* and a second avoidance hole 4101*b*. Both the first avoidance hole 4101*a* and the second avoidance hole 4101*b* run through the top optical waveguide film layer 41*a*. The intermediate optical waveguide film layer 41*c* is provided with a third avoidance hole 4101*c*. The third avoidance hole 4101*c* runs through the intermediate optical waveguide film layer 41*c*. The first avoidance hole 4101*a* is directly aligned with and communicated with the optical incident port 4100 of the intermediate optical waveguide film layer 41*c*, so that the top optical waveguide film layer 41*a* no longer blocks the optical incident port 4100 of the intermediate optical waveguide film layer 41*c*. The second avoidance hole 4101*b*, the third avoidance hole 4101*c*, and the optical incident port 4100 of the bottom optical waveguide film layer 41b are directly aligned and communicated, so that the top optical waveguide film layer 41a and the intermediate optical waveguide film layer 41c no longer block the optical incident port 4100 of the bottom optical waveguide film layer 41b.

In this design, the electronic device can have three fingerprint recognition areas. When the user touches a fingerprint recognition area opposite to the optical incident port 4100 of the top optical waveguide film layer 41a with a finger, the fingerprint detection light is sequentially transmitted to the fingerprint recognition module 30 through the top optical waveguide film layer 41a, the intermediate optical waveguide film layer 41c, and the bottom optical waveguide film layer 41b. When the user touches a fingerprint recognition area opposite to the optical incident port 4100 of the intermediate optical waveguide film layer 41c with a finger, the fingerprint detection light is sequentially transmitted to the fingerprint recognition module 30 through the first avoidance hole 4101a, the intermediate optical waveguide film layer 41c, and the bottom optical waveguide film layer 41b. When the user touches a fingerprint recognition area opposite to the optical incident port 4100 of the bottom optical waveguide film layer 41b with a finger, the fingerprint detection light is sequentially transmitted to the fingerprint recognition module 30 through the second avoidance hole 4101b, the third avoidance hole 4101c, and the bottom optical waveguide film layer 41b.

When the optical waveguide structure 40 includes at least four optical waveguide film layers 41, for a specific structure of the optical waveguide structure 40, refer to FIG. 11. Details are not described herein again.

It can be concluded according to the examples shown in FIG. 11 to FIG. 13 that, in an embodiment, the optical waveguide structure 40 may include a plurality of optical waveguide film layers 41. The plurality of optical waveguide film layers 41 are stacked and disposed, and orthographic projections thereof on the non-display surface of the display 20 all coincide. Each optical waveguide film layer 41 is provided with an optical incident port 4100 and an optical exit port 4120. The optical incident port 4100 is directly aligned with the fingerprint recognition area on the display 20. In addition, remaining optical waveguide film layers 41 located downstream of the top optical waveguide film layer 41a are provided with a conduction port 4102. The conduction port 4102 is communicated with an optical exit port 4120 of an adjacent optical waveguide film layer 41, to conduct two adjacent optical waveguide film layers 41. Remaining optical waveguide film layers 41 located upstream of the bottom optical waveguide film layer 41b are provided with an avoidance hole 4101, so that optical incident ports 4100 of the remaining optical waveguide film layers 41 located downstream of the top optical waveguide film layer 41a can be exposed on the first surface of the optical waveguide structure 40.

Based on the foregoing setting, the optical waveguide structure 40 has a plurality of optical incident ports 4100. Accordingly, the display 20 of the electronic device has a plurality of fingerprint recognition areas. In this way, the electronic device can be applied to single-finger fingerprint recognition, and can also be applied to multi-finger fingerprint recognition, to help meet different use requirements of the user. If single-finger fingerprint recognition is used to unlock the electronic device, the user can touch more fingerprint recognition areas with more selectivity, to facilitate a user operation. If multi-finger fingerprint recognition is used to unlock the electronic device, security is high.

It should also be noted that, when the plurality of optical incident ports 4100 are all provided on the top optical waveguide film layer 41a, the remaining optical waveguide film layers 41 located downstream of the top optical waveguide film layer 41a all cannot directly receive the fingerprint detection light. The remaining optical waveguide film layers 41 can only assist in transmitting the fingerprint detection light. In this case, the fingerprint detection light can be sequentially transmitted to the fingerprint recognition module 30 through the top optical waveguide film layer 41a, the intermediate optical waveguide film layer 41c, and the bottom optical waveguide film layer 41b, and a transmission path of each fingerprint detection light is long.

In this embodiment, each optical waveguide film layer 41 is provided with an optical incident port 4100, and the optical incident port 4100 is exposed on the first surface of the optical waveguide structure 40, so that each optical waveguide film layer 41 can directly receive the fingerprint detection light and transmit the fingerprint detection light to the fingerprint recognition module 30. Each optical waveguide film layer 41 can directly transmit the fingerprint detection light. In addition, a transmission process of the fingerprint detection light in remaining optical waveguide film layers 41 located upstream of the optical waveguide film layer 41 is eliminated, and a transmission path of partial fingerprint detection light is shortened.

Figure 14:
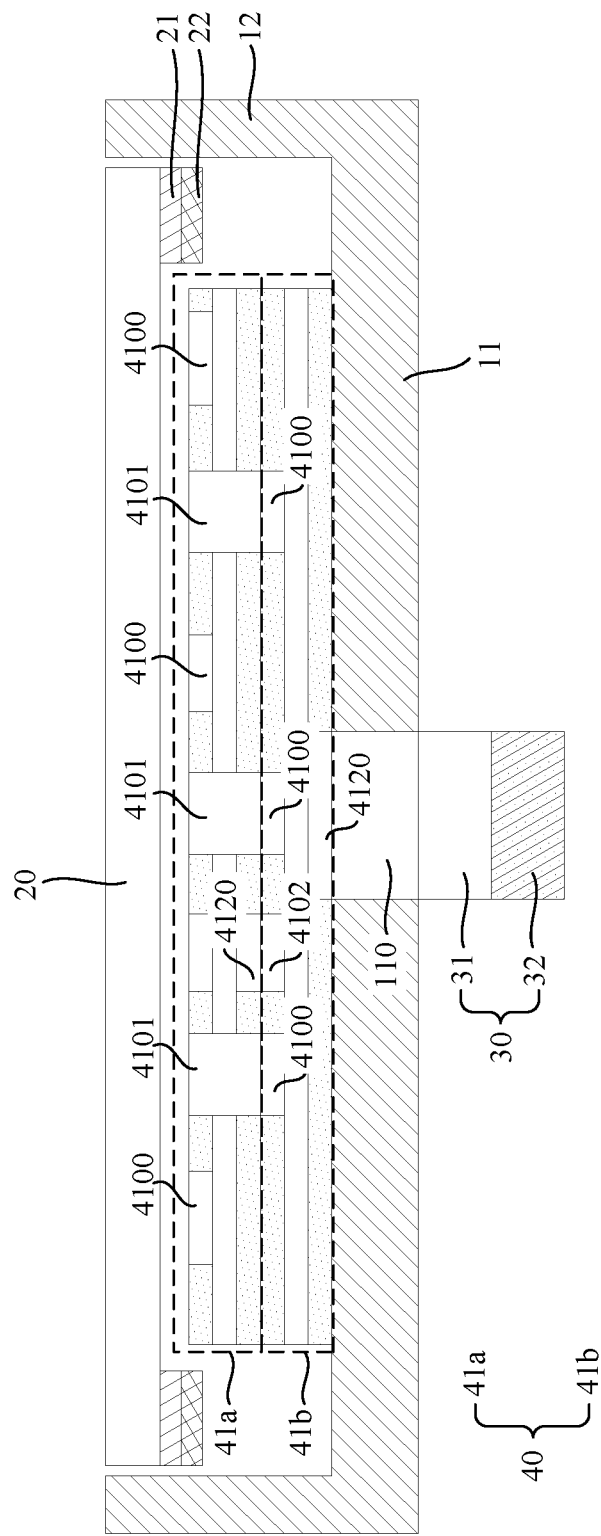
FIG. 14 is a cross sectional schematic view of a partial structure of an electronic device according to an eighth embodiment of this application.

In an embodiment in which the optical waveguide structure 40 includes a plurality of optical waveguide film layers 41, a quantity of optical incident ports 4100 on each optical waveguide film layer 41 is not limited to be one, and may alternatively be more than one. FIG. 14 schematically shows a cross section of a partial structure of an electronic device according to an eighth embodiment. For example, in the example shown in FIG. 14, when the optical waveguide structure 40 includes two optical waveguide film layers 41, the cover layer 410 of the top optical waveguide film layer 41a may be provided with four optical incident ports 4100, and the cover layer 410 of the bottom optical waveguide film layer 41b may be provided with a conduction port 4102 and three optical incident ports 4100. On the first surface of the optical waveguide structure 40, orthographic projections of the optical incident ports 4100 of the top optical waveguide film layer 41a and the optical incident ports 4100 of the bottom optical waveguide film layer 41b on the first surface are all provided in a staggered way, and the optical incident port 4100 of the bottom optical waveguide film layer 41b is also exposed on the first surface of the optical waveguide structure 40. In this case, the display 20 of the electronic device has seven fingerprint recognition areas.

Each optical waveguide film layer 41 is provided with a plurality of optical incident ports 4100. This greatly increases a quantity of the optical incident ports 4100 of the optical waveguide structure 40, and greatly increases a quantity of the fingerprint recognition areas on the electronic device. In this way, a quantity of finger fingerprints that can be recognized simultaneously by the electronic device is increased. This facilitates improving security and improves convenience of single-finger recognition. Specifically, in FIG. 14, when single-finger fingerprint recognition is used for unlocking, the user may choose to touch any of the seven fingerprint recognition areas depending on an actual usage scenario. This is convenient to operate.

Figure 15:
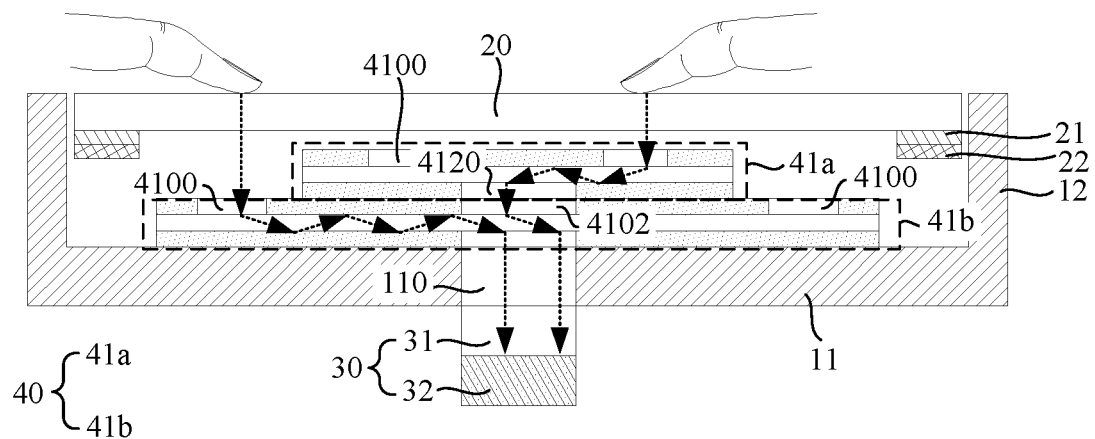
FIG. 15 is a cross sectional schematic view of a partial structure of an electronic device according to a ninth embodiment of this application.
Figure 16:
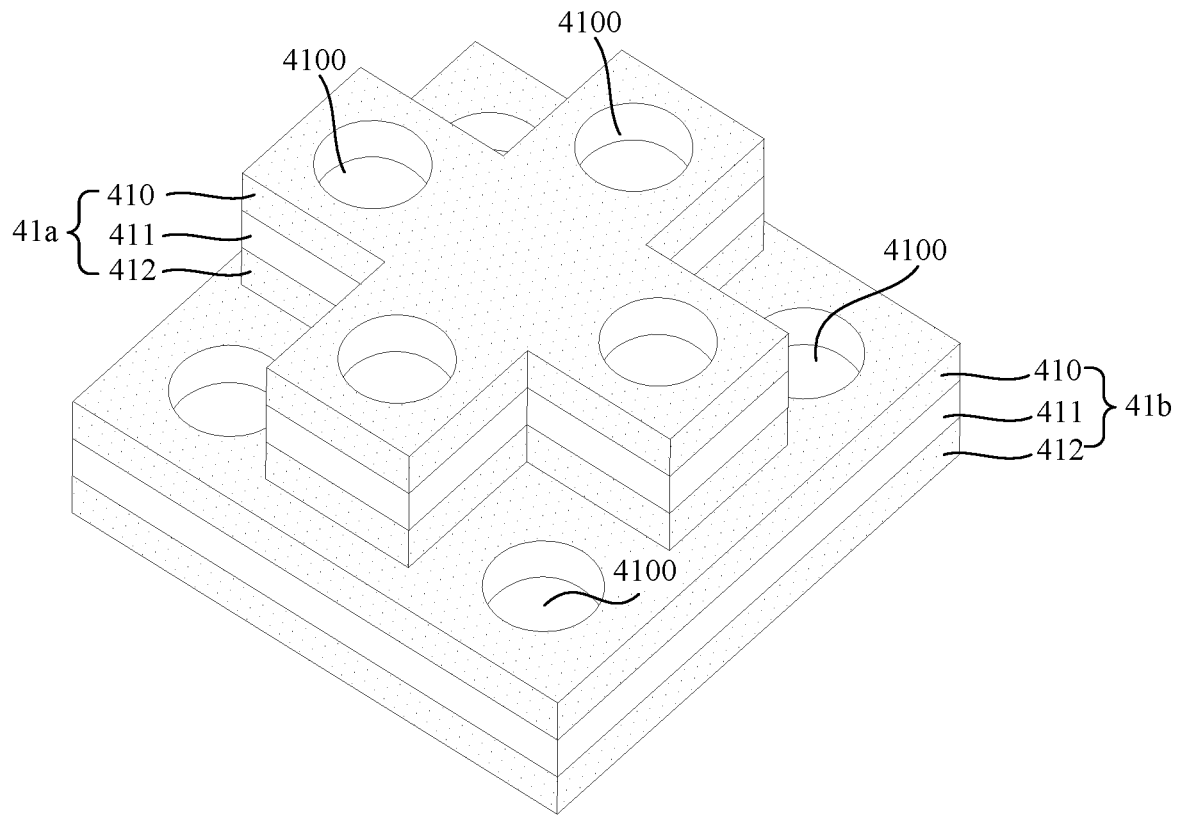
FIG. 16 is a three-dimensional schematic view of an optical waveguide structure according to still another embodiment of this application.
Figure 17:
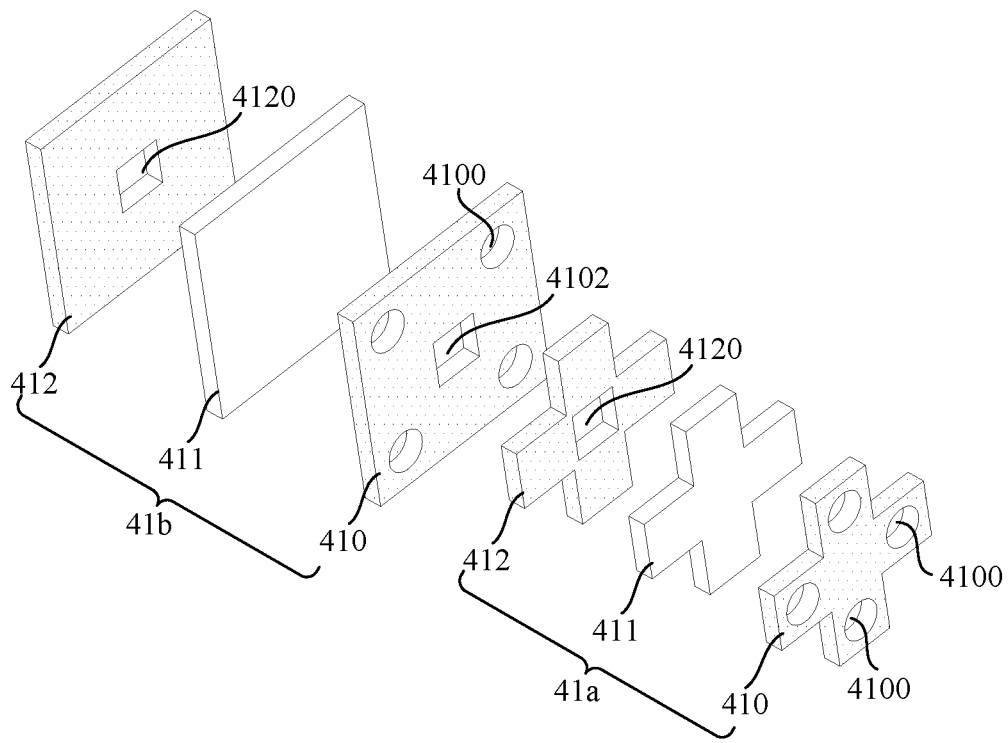
FIG. 17 is a schematic exploded view of an optical waveguide structure according to still another embodiment of this application.

When the optical waveguide structure 40 includes a plurality of optical waveguide film layers 41, in addition to providing the avoidance hole 4101 on the remaining optical waveguide film layers 41 located upstream of the bottom optical waveguide film layer 41b, another manner may be also used to enable the optical incident ports 4100 of the remaining optical waveguide film layers 41 located downstream of the top optical waveguide film layer 41*a* to be exposed on the first surface of the optical waveguide structure 40. FIG. 15 schematically shows a cross section of a partial structure of an electronic device according to a ninth embodiment. FIG. 16 shows an optical waveguide structure 40 according to still another embodiment. FIG. 17 shows an exploded structure of the optical waveguide structure 40 in FIG. 16. For example, as shown in FIG. 15 to FIG. 17, an orthographic projection of the top optical waveguide film layer 41*a* on the non-display surface of the display 20 is smaller than the orthographic projection of the bottom optical waveguide film layer 41*b* on the non-display surface of the display 20. In this way, the top optical waveguide film layer 41*a* cannot completely cover the bottom optical waveguide film layer 41*b*. A surface of the cover layer 410 of the bottom optical waveguide film layer 41*b* facing the display 20 includes a first area and a second area. The first area is opposite to the top optical waveguide film layer 41*a*, and the second area is not opposite to the top optical waveguide film layer 41*a*, so that the second area is not covered by the top optical waveguide film layer 41*a*.

In this example, the cover layer 410 of the top optical waveguide film layer 41*a* is provided with four optical incident ports 4100, and the base layer 412 of the top optical waveguide film layer 41*a* is provided with an optical exit port 4120. The first area of the cover layer 410 of the bottom optical waveguide film layer 41*b* is provided with a conduction port 4102. The conduction port 4102 is directly aligned with and communicated with the optical exit port 4120 of the top optical waveguide film layer 41*a*. The second area of the cover layer 410 of the bottom optical waveguide film layer 41*b* is provided with four optical incident ports 4100. The base layer 412 of the bottom optical waveguide film layer 41*b* is provided with an optical exit port 4120, and the optical exit port 4120 is directly aligned with the fingerprint recognition module 30.

The conduction port 4102 on the bottom optical waveguide film layer 41*b* can conduct the top optical waveguide film layer 41*a* and the bottom optical waveguide film layer 41*b*. The optical incident port 4100 of the top optical waveguide film layer 41*a*, the light guide layer 411 of the top optical waveguide film layer 41*a*, the optical exit port 4120 of the top optical waveguide film layer 41*a*, the conduction port 4102 of the bottom optical waveguide film layer 41*b*, the light guide layer 411 of the bottom optical waveguide film layer 41*b*, and the optical exit port 4120 of the bottom optical waveguide film layer 41*b* of the optical waveguide structure 40 are sequentially communicated to form a light transmission path. At the same time, because the top optical waveguide film layer 41*a* may not cover the second area of the bottom optical waveguide film layer 41*b*, the optical incident ports 4100 of the bottom optical waveguide film layer 41*b* may not be blocked by the top optical waveguide film layer 41*a*. The optical incident ports 4100 of the bottom optical waveguide film layer 41*b*, the light guide layer 411 of the bottom optical waveguide film layer 41*b*, and the optical exit port 4120 of the bottom optical waveguide film layer 41*b* are sequentially communicated to form a light transmission path.

In this way, the optical waveguide structure 40 shown in FIG. 16 has eight optical incident ports 4100, so that the electronic device with the optical waveguide structure 40 has eight fingerprint recognition areas. When in use, if the user press fingers on the fingerprint recognition areas opposite to the optical incident ports 4100 of the top optical waveguide film layer 41*a*, the fingerprint detection light can be sequentially transmitted to the fingerprint recognition module 30 through the top optical waveguide film layer 41*a* and the bottom optical waveguide film layer 41*b*. If the user press fingers on the fingerprint recognition areas opposite to the optical incident ports 4100 of the bottom optical waveguide film layer 41*b*, the fingerprint detection light can be directly emitted into the optical incident ports 4100 of the bottom optical waveguide film layer 41*b*, and directly transmitted from the bottom optical waveguide film layer 41*b* to the fingerprint recognition module 30.

Therefore, the electronic device has a plurality of fingerprint recognition areas, so that the electronic device can implement both single-finger fingerprint recognition and multi-finger fingerprint recognition. In addition, in comparison with the examples shown in FIG. 11 to FIG. 14, in this embodiment, the remaining optical waveguide film layers 41 located upstream of the bottom optical waveguide film layer 41*b* can receive the fingerprint detection light without being provided with an avoidance hole 4101. A phase that the fingerprint detection light passes through the avoidance hole 4101 is eliminated, and the transmission path of the fingerprint detection light is simplified.

Certainly, in other embodiments, the quantity of optical incident ports 4100 on the cover layer 410 of the top optical waveguide film layer 41*a* and the quantity of optical incident ports 4100 on the cover layer 410 of the bottom optical waveguide film layer 41*b* may alternatively be one, two, three, five, or the like.

Figure 18:
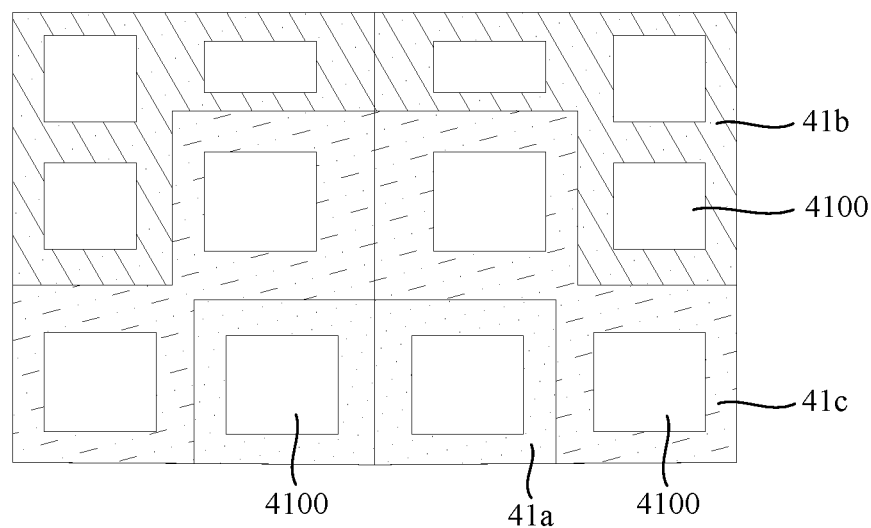
FIG. 18 is a top view of an optical waveguide structure according to yet another embodiment of this application.

FIG. 18 schematically shows a top-view structure of an optical waveguide structure 40 according to yet another embodiment. As shown in FIG. 18, when the optical waveguide structure 40 includes three optical waveguide film layers 41, an orthographic projection of the optical waveguide structure 40 configured into the three optical waveguide film layers 41 on the non-display surface of the display 20 gradually increases from the top optical waveguide film layer 41*a*, the intermediate optical waveguide film layer 41*c* to the bottom optical waveguide film layer 41*b*. Each of the three optical waveguide film layers 41 is provided with an optical exit port 4120 and at least one optical incident port 4100. The optical incident port 4100 of the intermediate optical waveguide film layer 41*c* is provided at a location that is not directly aligned with the top optical waveguide film layer 41*a*, and the optical incident port 4100 of the bottom optical waveguide film layer 41*b* is provided at a location that is not directly aligned with the intermediate optical waveguide film layer 41*c*.

When the optical waveguide structure 40 includes at least four optical waveguide film layers 41, for a specific structure of the optical waveguide structure 40, refer to FIG. 16. Details are not described herein again.

In general, in another embodiment, the optical waveguide structure 40 may include a plurality of optical waveguide film layers 41. The plurality of optical waveguide film layers 41 are stacked and disposed. An orthographic projection of each optical waveguide film layer 41 on the non-display surface of the display 20 increases from the first surface of the optical waveguide structure 40 to the second surface of the optical waveguide structure 40. In other words, an orthographic projection of the optical waveguide film layer 41 located upstream of a propagation path of the fingerprint detection light on the non-display surface of the display 20 is smaller than an orthographic projection of the optical waveguide film layer 41 located downstream of the propagation path of the fingerprint detection light on the non-display surface of the display 20. Therefore, each optical waveguide film layer 41 does not completely cover the downstream optical waveguide film layer 41.

In addition, each optical waveguide film layer 41 is provided with an optical exit port 4120 and at least one optical incident port 4100. The optical incident port 4100 of each optical waveguide film layer 41 is not covered by the upstream optical waveguide film layer 41, so that the optical incident port 4100 of each optical waveguide film layer 41 can be exposed on the first surface of the optical waveguide structure 40. In addition, remaining optical waveguide film layers 41 located downstream of the top optical waveguide film layer 41a are provided with a conduction port 4102. The conduction port 4102 is communicated with an optical exit port 4120 of an adjacent optical waveguide film layer 41, to conduct two adjacent optical waveguide film layers 41.

Based on the foregoing setting, the optical waveguide structure 40 has a plurality of optical incident ports 4100. Accordingly, the display 20 of the electronic device has a plurality of fingerprint recognition areas. In this way, the electronic device can be applied to single-finger fingerprint recognition, and can also be applied to multi-finger fingerprint recognition, to help meet different use requirements of the user. If single-finger fingerprint recognition is used to unlock the electronic device, there are many fingerprint recognition areas that the user can touch. In this way, selectivity is high, and user operation is easy. If multi-finger fingerprint recognition is used to unlock the electronic device, security is high.

It should also be noted that, in a solution in which the optical waveguide structure 40 includes an optical waveguide film layer 41, a plurality of optical incident ports 4100 may be provided on the cover layer 410 of the optical waveguide film layer 41, or in a solution in which the optical waveguide structure 40 includes a plurality of optical waveguide film layers 41, a plurality of optical incident ports 4100 may be provided on the top optical waveguide film layer 41a, so that the electronic device can also have a plurality of fingerprint recognition areas. However, because a size of the optical waveguide film layer 41 is limited, and the fingerprint detection light needs to be reflected on the cover layer 410 of the optical waveguide film layer 41, to avoid that the fingerprint detection light may not be emitted from the optical incident port 4100. Therefore, a quantity of the optical incident ports 4100 on the optical waveguide film layer 41 cannot be designed to be too large, so that the fingerprint recognition area occupies a small area on the display 20. In this way, when it is needed to unlock, verify, or pay, an area of the display 20 that the user can touch is small, resulting in a situation that it is still difficult for the user to touch the fingerprint recognition area in some use scenarios.

In this embodiment, a plurality of optical incident ports 4100 are respectively provided on a plurality of optical waveguide film layers 41, and a quantity of the optical waveguide film layers 41 and a quantity and a location of the optical incident ports 4100 on each optical waveguide film layer 41 are properly designed. In this way, under a condition that the fingerprint detection light may not be emitted from the optical incident port 4100, the quantity of the optical incident ports 4100 of the optical waveguide structure 40 can be designed to be large, so that an orthographic projection of all optical incident ports 4100 of the optical waveguide structure 40 on the non-display surface of the display 20 occupies a large area on the display 20, and the fingerprint recognition area occupies a large area on the display 20. In this setting, most areas on the display 20 are fingerprint recognition areas. When it is needed to unlock, verify, or pay, the user can touch most locations on the display 20 to complete fingerprint recognition, and the user can easily touch the fingerprint recognition area. This further improves convenience of fingerprint recognition.

In the foregoing embodiment, the remaining optical waveguide film layers 41 located downstream of the top optical waveguide film layer 41a are provided with a conduction port 4102 and an optical exit port 4120, and the conduction port 4102 is adjacent to the optical exit port 4120, so that the fingerprint detection light can be conducted to the optical exit port 4120 after a few times of refraction after being transmitted into the optical waveguide film layer 41 through the conduction port 4102. This facilitates shortening a transmission path of the fingerprint detection light in the remaining optical waveguide film layers 41, and facilitates improving a rate at which the fingerprint recognition module 30 receives the fingerprint detection light.

For example, as shown in FIG. 13, the conduction port 4102 may alternatively be disposed coaxially with the optical exit port 4120. In this way, based on a reasonable design of a size of the conduction port 4102, the fingerprint detection light that passes through the conduction port 4102 to the optical waveguide film layer 41 can enter the optical exit port 4120 after refraction occurs once.

Combining the contents described in Embodiment 1 and embodiment 2, in this embodiment, the optical waveguide structure 40 is disposed between the display 20 and the fingerprint recognition module 30. According to the content described above, in general, the optical waveguide structure 40 can include one optical waveguide film layer 41 or a plurality of optical waveguide film layers 41. In addition, regardless of a quantity of the optical waveguide film layers 41 included in the optical waveguide structure 40 is one or more, at least two optical incident ports 4100 are exposed on the first surface of optical waveguide structure 40. Each optical incident port 4100 is directly aligned with the fingerprint recognition area, and an orthographic projection of at least one optical incident port 4100 on the first surface of the optical waveguide structure 40 does not coincide with the orthographic projection of the fingerprint recognition module 30 on the first surface of the optical waveguide structure 40. An optical exit port 4120 is exposed on the second surface of the optical waveguide structure 40, and the optical exit port 4120 is directly aligned with the fingerprint recognition module 30.

In this way, the display 20 of the electronic device has at least two fingerprint recognition areas, and at least one fingerprint recognition area is not directly aligned with the fingerprint recognition module. When the user touches any of the fingerprint recognition areas with a finger, the optical waveguide structure 40 can transmit the fingerprint detection light reflected by the finger in the fingerprint recognition area to the fingerprint recognition module 30, to complete fingerprint recognition.

In the descriptions of embodiments of this application, it should be noted that, unless otherwise specified or limited, terms "mount", "communicate", and "connect" shall be understood in a broad sense, for example, may be a fixed connection, may be an indirect connection by using an intermediate medium, or may be a connection between insides of two elements or an interaction relationship between two elements. A person of ordinary skill in the art can understand specific meanings of the foregoing terms in embodiments of this application depending on a specific situation.

The terms such as "first", "second", "third", and "fourth" (if any) in the specification and claims of embodiments of this application and in the accompanying drawings are used for distinguishing between similar objects and not necessarily used for describing any particular order or sequence.

What is claimed is:

1. An electronic device, comprising:
   a middle frame;
   a display, disposed on a side of the middle frame, wherein the display is configured to receive finger contact;
   a fingerprint recognition module, disposed on a side of the display facing the middle frame; and
   an optical waveguide structure, disposed between the display and the fingerprint recognition module,
   wherein a plurality of optical incident ports are exposed on a first surface of the optical waveguide structure facing the display, each optical incident port is directly aligned with a fingerprint recognition area of the display, an optical exit port is exposed on a second surface of the optical waveguide structure facing the fingerprint recognition module, the optical exit port is directly aligned with the fingerprint recognition module, fingerprint detection light formed by a finger in the fingerprint recognition area is incident into the optical waveguide structure through the optical incident port and be transmitted to the fingerprint recognition module through the optical exit port, and an orthographic projection of at least one optical incident port on the first surface does not coincide with an orthographic projection of the optical exit port on the second surface;
   wherein the optical waveguide structure comprises a plurality of optical waveguide film layers, and each optical waveguide film layer is provided with an optical incident port and an optical exit port;
   wherein the optical waveguide film layer adjacent to a first surface of the display is a top optical waveguide film layer comprising of the first surface of the optical waveguide structure, and the optical waveguide film layer adjacent to the middle frame is a bottom optical waveguide film layer comprising of the second surface of the optical wave guide structure;
   wherein a conduction port is provided on a cover layer of the bottom optical waveguide film layer, and is directly aligned with the optical exit port of the top optical waveguide film layer;
   wherein an orthographic projection of the conduction port does not coincide with an orthographic projection of the optical incident port on the first surface;
   wherein an avoidance hole is provided on the top optical waveguide film layer and the optical incident port of the bottom optical waveguide film layer is in communication with the avoidance hole, the avoidance hole enables the optical incident port of the bottom optical waveguide film layer to be exposed on the first surface of the optical waveguide structure.

2. The electronic device according to claim 1, wherein each of the optical waveguide film layers comprises a base layer, a light guide layer, and a cover layer sequentially stacked and disposed, each base layer is provided with an optical exit port, and the cover layer is provided with an optical incident port; and a refractive index of each light guide layer is greater than a refractive index of the base layer and a refractive index of the cover layer, to enable the base layer and the cover layer to perform total reflection on the fingerprint detection light.

3. The electronic device according to claim 2, wherein the base layers and the cover layers are both metal layers or metal oxide layers.

4. The electronic device according to claim 2, wherein the light guide layers are a film layer made of glass or a transparent resin.

5. The electronic device according to claim 1, wherein orthographic projections of the optical waveguide film layers on a surface of the display facing the middle frame coincide.

6. The electronic device according to claim 1, wherein orthographic projections of the optical waveguide film layers on the surface of the display facing the middle frame sequentially increases from the first surface of the optical waveguide structure to the second surface of the optical waveguide structure; and
   the optical incident port of the top optical waveguide film layer is provided in an area where the optical waveguide film layer is not covered by another optical waveguide film layer.

7. The electronic device according to claim 1, wherein a quantity of the optical incident port provided on each optical waveguide film layer is more than one.

8. The electronic device according to claim 2, wherein a thickness of the light guide layer is greater than or equal to 20 μm, and less than or equal to 40 μm; and a thickness of the optical waveguide film layer is greater than or equal to 100 μm, and less than or equal to 200 μm.

9. The electronic device according to claim 1, wherein the fingerprint recognition module is disposed on a side of the middle frame facing away from the display, the middle frame is provided with a through hole, and the through hole is directly aligned with the optical exit port and the fingerprint recognition module.

10. The electronic device according to claim 9, wherein the fingerprint recognition module comprises a lens and a fingerprint sensor, and the lens is disposed on a surface of the fingerprint sensor facing the optical waveguide structure.

11. The electronic device according to claim 1, wherein the fingerprint recognition module is disposed on a surface of the middle frame facing the display.

12. The electronic device according to claim 1, wherein the optical waveguide structure is connected to a surface of the display facing the fingerprint recognition module.

13. The electronic device according to claim 1, wherein the optical waveguide film layer is connected to the middle frame, and the optical waveguide film layer is located between the middle frame and the display.

14. The electronic device according to claim 1, wherein the display is an organic light-emitting diode display.

* * * * *